United States Patent
Kim

(10) Patent No.: US 9,444,472 B2
(45) Date of Patent: Sep. 13, 2016

(54) DIGITALLY CONTROLLED OSCILLATOR AND ELECTRONIC DEVICE INCLUDING THE SAME

(71) Applicant: Samsung Electronics Co., Ltd., Suwon-si (KR)

(72) Inventor: Du-ho Kim, Seoul (KR)

(73) Assignee: Samsung Electronics Co., Ltd. (KR)

(*) Notice: Subject to any disclaimer, the term of this patent is extended or adjusted under 35 U.S.C. 154(b) by 0 days.

(21) Appl. No.: 14/322,280

(22) Filed: Jul. 2, 2014

(65) Prior Publication Data

US 2015/0061779 A1 Mar. 5, 2015

(30) Foreign Application Priority Data

Aug. 28, 2013 (KR) .................. 10-2013-0102661

(51) Int. Cl.
| | |
|---|---|
| H03L 1/00 | (2006.01) |
| H03L 7/099 | (2006.01) |
| H03L 1/02 | (2006.01) |
| G06F 1/08 | (2006.01) |
| H03L 7/06 | (2006.01) |
| H03L 5/02 | (2006.01) |

(52) U.S. Cl.
CPC .............. H03L 7/099 (2013.01); G06F 1/08 (2013.01); H03L 1/00 (2013.01); H03L 1/02 (2013.01); H03L 5/02 (2013.01); H03L 7/06 (2013.01)

(58) Field of Classification Search
CPC ........... H03L 5/02; H03L 7/06; H03L 7/099; H03L 1/02; H03L 1/00; G06F 1/08

USPC .................. 331/14, 25, 182, 183, 185, 186; 323/265, 304, 351
See application file for complete search history.

(56) References Cited

U.S. PATENT DOCUMENTS

| | | | |
|---|---|---|---|
| 6,249,876 B1 | 6/2001 | Balakrishnan et al. | |
| 6,914,547 B1* | 7/2005 | Swaroop | H03M 1/682 341/144 |
| 7,221,304 B2* | 5/2007 | Yen | G09G 3/3611 341/145 |
| 7,602,260 B1* | 10/2009 | Atesoglu | 331/186 |
| 7,948,330 B2 | 5/2011 | Seo et al. | |
| 7,973,612 B2 | 7/2011 | Raghunathan et al. | |
| 8,222,962 B2 | 7/2012 | Lin et al. | |
| 8,269,563 B2 | 9/2012 | Ballantyne | |
| 8,878,614 B2* | 11/2014 | Yin | H03L 7/099 327/147 |
| 2008/0122550 A1* | 5/2008 | Kurd et al. | 331/185 |
| 2009/0302958 A1 | 12/2009 | Sakurai et al. | |

(Continued)

FOREIGN PATENT DOCUMENTS

| | | |
|---|---|---|
| KR | 2005103542 | 11/2005 |
| KR | 100569878 | 4/2006 |

(Continued)

*Primary Examiner* — Richard Tan
(74) *Attorney, Agent, or Firm* — Onello & Mello, LLP

(57) ABSTRACT

Provided are a digitally controlled oscillator and an electronic device including the digitally controlled oscillator. The digitally controlled oscillator includes a digital control unit and a power control oscillation unit. The digital control unit compensates for a difference between a feedback signal of an output power and a reference power set based on an input digital control signal and outputting an output power. The power control oscillation unit receives a signal related to the output power, and generates an output clock having an oscillation frequency in response to the signal related to the output power.

14 Claims, 22 Drawing Sheets

(56) References Cited

U.S. PATENT DOCUMENTS

2011/0006851 A1 1/2011 Kim
2011/0309886 A1 12/2011 Moussavi et al.
2012/0112842 A1 5/2012 Ainspan et al.
2012/0223778 A1 9/2012 Shin et al.

FOREIGN PATENT DOCUMENTS

| KR | 2009016093 | 2/2009 |
| KR | 2012008965 | 2/2012 |
| KR | 2012023997 | 3/2012 |

* cited by examiner

DIGITALLY CONTROLLED OSCILLATOR AND ELECTRONIC DEVICE INCLUDING THE SAME

CROSS-REFERENCE TO RELATED APPLICATIONS

This application claims the benefit of Korean Patent Application No. 10-2013-0102661, filed on Aug. 28, 2013, in the Korean Intellectual Property Office, the disclosure of which is incorporated herein in its entirety by reference.

BACKGROUND

1. Field

The inventive concept relates to a digitally controlled oscillator and an electronic device including the digitally controlled oscillator, and more particularly, to a digitally controlled oscillator capable of accurately controlling frequency generation or reducing a layout area and an electronic device including the digitally controlled oscillator.

2. Description of Related Art

An oscillator has to be accurately controlled so as to generate an accurate frequency at which an electronic device stably operates without regard to a change in an environment such as a temperature or a manufacturing error generated in a process. Typically, a layout area of an oscillator is large in order to achieve this.

SUMMARY

The inventive concept provides a digitally controlled oscillator capable of accurately controlling a frequency generation process or reducing a layout area, and an electronic device including the digitally controlled oscillator.

According to an aspect of the inventive concept, there is provided a digitally controlled oscillator including: a digital control unit that compensates for a difference between a feedback signal received from an output of the digital control unit power and a reference power, and outputs an output power in response to the compensated difference, wherein a power level of the reference power is set in response to an input digital control signal; and a power control oscillation unit that receives a signal related to the output power, and generates an output clock having an oscillation frequency in response to the signal related to the output power.

In some embodiments, the reference power and the output power each includes a power supply voltage.

In some embodiments, the digital control unit comprises a power level setting unit for setting the power level of the reference power in response to the digital control signal; and a power level compensation unit for compensating for the difference between the reference power and the feedback signal.

In some embodiments, the power level setting unit comprises a power level setting unit including a plurality of unit level cells, a number of which corresponds to a value of $2^N$, wherein N is a number of bits in the digital control signal; and a selection unit for selecting the power level of the reference power as one of first power levels by turning on or turning off of each of the unit level cells in response to the digital control signal, wherein a number of the first power levels is the same as the value of $2^N$.

In some embodiments, the power level setting unit comprises: a first power level setting unit that outputs a temporary reference power in response to a first bit location value of the digital control signal; and a second power level setting unit that modulates a power level of the temporary reference power and outputs the modulated temporary reference power as the reference power in response to a second bit location value of the digital control signal.

In some embodiments, a sum of the number of the unit level cells included in the first power level setting unit and the second power level setting unit is less than the value of $2^N$.

In some embodiments, the first bit location value of the digital control signal is a value represented by an arbitrary number of upper bits in the digital control signal, and the second bit location value of the digital control signal is a value represented by other bits except for the arbitrary number of upper bits in the digital control signal.

In some embodiments, the first power level setting unit sets one of a plurality of second power levels as a power level of the temporary reference power, and the second power level setting unit applies one of weighted values to the power level of the temporary reference power to set the power level of the reference power, and wherein the number of the second power levels corresponds to a number of arbitrary upper bits of the digital control signal representing the first bit location value, and the number of the weighted values corresponds to the number of remaining bits except for the arbitrary upper bits in the digital control signal.

In some embodiments, the first power level setting unit sets two second power levels as a first power level and a second power level, respectively, of the temporary reference power, and the second power level setting unit sets the power level of the reference power, the number of the second power levels corresponds to the first bit location value, the power level of the reference power is obtained by adding a third power level and a fourth level, the third power level is calculated by applying a first coefficient to a first difference value corresponding to the first power level of the temporary reference power, and the fourth power level is calculated by applying a second coefficient to a second difference value corresponding to a difference between the second power level of the temporary reference power and a power level of the feedback signal of the output power.

In some embodiments, the second power setting unit comprises an interpolator, the interpolator comprises a first multiplier that multiplies the first difference value by the first coefficient; a second multiplier that multiplies the second difference value by the second coefficient; and an adder that generates and outputs the reference power by adding an output of the first multiplier and an output of the second multiplier.

In some embodiments, a sum of the first coefficient and the second coefficient is 1, and the first coefficient is in a monotone increasing state and the second coefficient is in a monotone decreasing state, or the first coefficient is in a monotone decreasing state and the second coefficient is in a monotone increasing state, with respect to the power level of the temporary reference power.

In some embodiments, the digitally controlled oscillator further comprises a sigma-delta modulator (SDM) for modulating the first and second coefficients.

In some embodiments, the power level setting unit comprises a first power level setting unit that outputs a first temporary reference power in response to the first bit location value of the digital control signal; a second power level setting unit that modulates and outputs a power level of the first temporary reference power as a second temporary reference power in response to the second bit location value of the digital control signal; and a third power level setting unit that modulates and outputs a power level of the second temporary reference power as the reference power in response to a third bit location value of the digital control signal.

In some embodiments, the power level compensation unit comprises a comparing unit that compares the reference power transmitted from the power level setting unit and the fed back output power and outputs the difference value and a constant power supply unit that supplies the output power in response to a compensation for the difference value.

In some embodiments, the power control oscillation unit comprises a ring type oscillator that includes a plurality of unit delay cells having different delays according to a power level of the output power.

In some embodiments, the digital control unit further comprises a divider for dividing the output power, compensates for a difference between the divided output power and the reference power, and outputs a compensated value as the output power.

In some embodiments, the digital control unit comprises a comparing unit that generates a first difference value and a second difference value in response to a comparison performed between the reference power and the divided output power; a first multiplier that multiplies the first difference value by the first coefficient; a second multiplier that multiplies the second difference value by the second coefficient; an adder that adds an output of the first multiplier and an output of the second multiplier; and a constant power supply unit that controls a current according to an output of the adder and outputs power.

In some embodiments, the digital control unit comprises: a first comparing unit that compares an output power that is divided as a first value and fed back by the divider with the reference power to output a first difference value; a second comparing unit that compares the output power divided as a second value by the divider and fed back with the reference power to output a second difference value; a first multiplier that multiplies the first difference value by the first coefficient; a second multiplier that multiplies the second difference value by the second coefficient; an adder that adds an output of the first multiplier and an output of the second multiplier; and a constant power supply unit that controls a current according to an output of the adder and outputs the output power.

In some embodiments, the digital control unit comprises: a first comparing unit that compares a first reference power in the reference power and the feedback signal to generate a first difference value; a second comparing unit that compares a second reference power in the reference power and the feedback signal to generate a second difference value; a first multiplier that multiplies the first difference value by a first coefficient; a second multiplier that multiplies the second difference value by a second coefficient; an adder that adds an output of the first multiplier and an output of the second multiplier; and a constant power supply unit that controls a current according to an amount of the adder and outputs the output power.

According to another aspect of the inventive concept, there is provided an electronic device comprising: a digitally controlled oscillator. The oscillator comprises a digital control unit that outputs an output power by compensating for a difference between a feedback signal received from an output of the digital control unit and a reference power, a power level of the reference power is set in response to an input digital control signal, and a power control oscillation unit that receives a signal related to the output power, and generates an output clock having an oscillation frequency in response to the signal related to the output power. The electronic device further comprises a functional block that operates in synchronization with an output clock.

In some embodiments, the electronic device further comprises a phase locked loop or a clock data recovery circuit including the digitally controlled oscillator.

In some embodiments, the digital control signal is generated by a digital loop filter included in the phase locked loop, or to correspond to a temperature code corresponding to a temperature detected by a temperature detection unit included in the electronic device.

In some embodiments, the digital control unit comprises: a first comparing unit that compares a first reference power in the reference power with the feedback signal of the output power to generate a first difference value; a second comparing unit that compares a second reference power in the reference voltage with the feedback signal of the output power to generate a second difference value; a first multiplier that multiplies the first difference value by a first coefficient; a second multiplier that multiplies the second difference value by a second coefficient; an adder that adds an output of the first multiplier and an output of the second multiplier; and a constant power supply unit that controls a current according to an output of the adder and outputs the output power.

According to another aspect of the inventive concept, there is provided a digitally controlled oscillator including: a voltage control oscillation unit that outputs an output clock at an oscillation frequency corresponding to a voltage level of a power voltage; and a digital control unit that receives a digital control signal having N bits and sets one of $2^N$ voltage levels as the voltage level of the power voltage. The digital control unit sets one of the $2^i$ voltage levels as a primary voltage level of the power voltage according to an upper bit value represented by i upper bits in the digital control signal, and sets a voltage level of the power voltage by applying one of $2^{N-I}$ weighted values to the primary voltage level of the power voltage according to a lower bit value represented by N−i lower bits in the digital control signal.

According to another aspect of the inventive concept, there is provided a digitally controlled oscillator including: a voltage controlled oscillation unit that outputs an output clock at an oscillation frequency corresponding to a voltage level of a power voltage; and a digital control unit that receives a digital control signal having N bits and sets one of $2^N$ voltage levels as the voltage level of the power voltage. The digital control unit comprises: a first voltage level setting unit that outputs a pair of voltage levels from among the $2^i$ voltage levels as a first reference voltage and a second reference voltage according to an upper bit value represented by i upper bits in the digital control signal; and an interpolator that multiplies one or more differences between the first reference voltage and the second reference voltage and a feedback signal of the power voltage by a coefficient corresponding to a lower bit value represented by N−i lower bits in the digital control signal. A constant voltage supply unit controls a current according to an output of the interpolator to compensate for the voltage level of the power voltage.

According to another aspect of the inventive concept, there is provided a digitally controlled oscillator comprising: a digital control unit that receives a digital control signal, generates a reference power in response to the digital control signal, generates a comparison value by comparing the reference power to a feedback signal received from an output of the digital control unit, and generates an output power in response to the comparison value; and a power control oscillation unit that receives the output power and generates an output clock at an oscillation frequency corresponding to the output power.

In some embodiments, the digital control unit comprises a power level setting unit that sets a power level of the reference power in response to the digital control signal, and a power level compensation unit that generates the comparison signal by compensating for the difference between the reference power and the feedback signal.

In some embodiments, the power level setting unit comprises a power level setting unit including a plurality of unit level cells, a number of which corresponds to a value of $2^N$, wherein N is a number of bits in the digital control signal; and a selection unit for selecting the power level of the reference power as one of first power levels by turning on or turning off of each of the unit level cells in response to the digital control signal, wherein a number of the first power levels is the same as the value of $2^N$.

In some embodiments, the power level setting unit comprises: a first power level setting unit that outputs a temporary reference power in response to a first bit location value of the digital control signal; and a second power level setting unit that modulates a power level of the temporary reference power and outputs the modulated temporary reference power as the reference power in response to a second bit location value of the digital control signal.

In some embodiments, the digital control unit further comprises a divider for dividing the output power, compensates for a difference between the divided output power and the reference power, and outputs a compensated value as the output power.

BRIEF DESCRIPTION OF THE DRAWINGS

Exemplary embodiments of the inventive concept will be more clearly understood from the following detailed description taken in conjunction with the accompanying drawings in which.

DETAILED DESCRIPTION OF THE EMBODIMENTS

Figure 1:
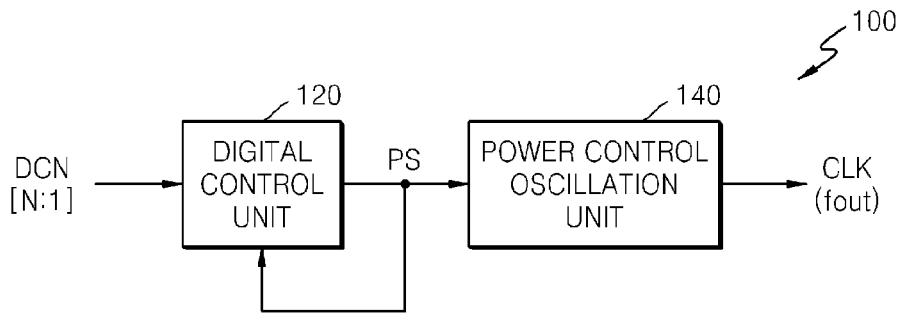
FIG. 1 is a block diagram of a digitally controlled oscillator according to an embodiment of the present inventive concept.

Hereinafter, the inventive concept will be described more fully with reference to the accompanying drawings, in which exemplary embodiments of the inventive concept are shown. Like reference numerals in the drawings denote like elements. As used herein, the term "and/or" includes any and all combinations of one or more of the associated listed items. Expressions such as "at least one of," when preceding a list of elements, modify the entire list of elements and do not modify the individual elements of the list.

FIG. 1 is a block diagram of a digitally controlled oscillator 100 according to an embodiment of the present inventive concept. Referring to FIG. 1, the digitally controlled oscillator 100 according to the present embodiment uses a digital control signal DCN as a signal for controlling an oscillation frequency font. Due to characteristics of the high speed electronic device in which the oscillator 100 may be used, the oscillation frequency fout may be generated inaccurately due to noise or the like, whereby a wrong operation of the electronic device may be generated. Also, due to the development of precise electronic devices, the oscillation frequency fout has to be finely adjusted. The digitally controlled oscillator 100 according to the present embodiment controls the oscillation frequency fout by using a digital control signal DCN, and thus, may precisely control the oscillation frequency fout with high resolution against noise.

The digitally controlled oscillator 100 includes a digital control unit 120 and a power control oscillation unit 140 for controlling the oscillation frequency font in response to the digital control signal DCN, or more specifically, for accurately generating an output clock CLK as the required oscillation frequency fout. The digital control unit 120 compensates for a difference between a signal that is fed back as an output power PS and a reference power set in response to the input digital control signal DCN, and outputs a compensated signal as an output power PS. The digital control signal DCN may be a digital code having N number of bits. Therefore, the digital control signal DCN may be applied as one of the $2^N$ digital values. For example, if the digital control signal DCN is 2 bits (N=2), the digital control signal DCN may be applied as one of four digital values, i.e., 00, 01, 10, and 11.

The digital control signal DCN may be applied to the digital control unit 120 as a digital value corresponding to a necessary adjustment of the oscillation frequency fout due to an environment variation. Examples of an environment-related variation may include but not be limited to a temperature of the digitally controlled oscillator 100 or electronic device including the digitally controlled oscillator 100, or manufacturing errors occurring during processes. Detailed descriptions of devices and/or approaches for generating a digital control signal DCN are described herein.

The power control oscillation unit 140 receives a signal related to the output power PS, and generates the output clock CLK with the oscillation frequency fout corresponding to the output power PS. The oscillation frequency fout may be one of the $2^N$ values, where N is the number of bits of the digital control signal DCN. That is, if the number of bits of the digital control signal DCN of the digitally controlled oscillator 100 according to the present embodiment is N, then a resolution of the digitally controlled oscillator 100 may be $2^N$.

Figure 2:
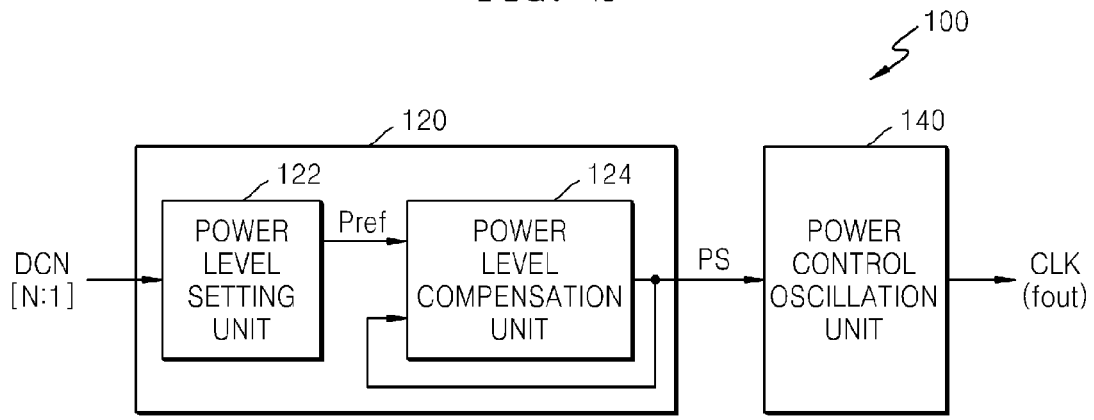
FIG. 2 is a diagram of a digital control unit shown in FIG. 1.

FIG. 2 is a diagram of an example of the digital control unit 120 of FIG. 1. Referring to FIG. 2, the digital control unit 120 includes a power level setting unit 122 and a power level compensation unit 124. The electric power level setting unit 122 may set an electric power level of a reference power Pref in response to the digital control signal DCN. The power level compensation unit 124 may compensate for a difference between the reference power Pref and a signal that is fed back by the output power PS.

As such, according to the digitally controlled oscillator 100 of the present embodiment, even if there is no additional digital/analog converter, the digital control unit 120 is part of the digitally controlled oscillator 100, and can perform the digital/analog conversion, more specifically, outputting the analog output power PS based on the digital control signal DCN, and also compensates for the voltage level of the output power PS based on the signal that is fed back by the output power PS. Thus, the oscillation frequency fout may be stably and accurately generated while also allowing for a reduced layout area of the digitally controlled oscillator 100 or an electronic device including the digitally controlled oscillator 100.

Figure 3:
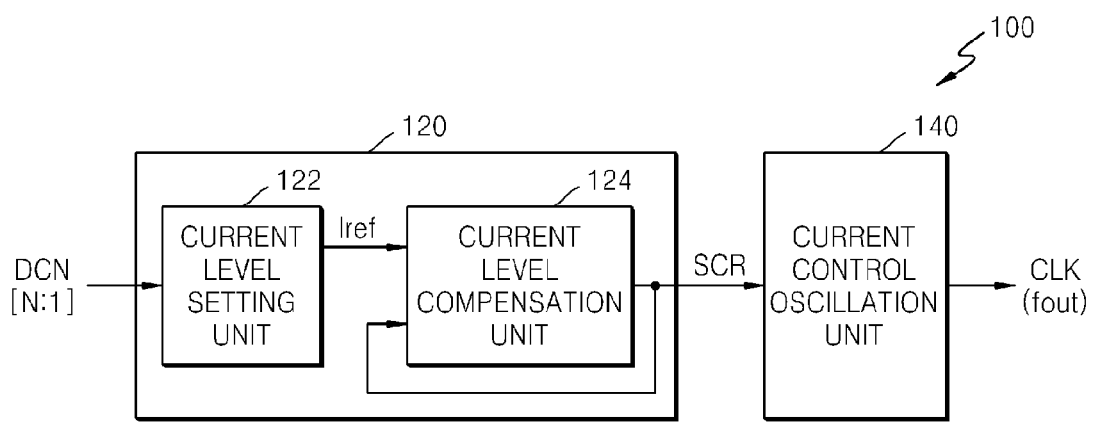
FIGS. 3 and 4 are diagrams of an electric power generation device of the digitally controlled oscillator shown in FIG. 1 or FIG. 2.
Figure 4:
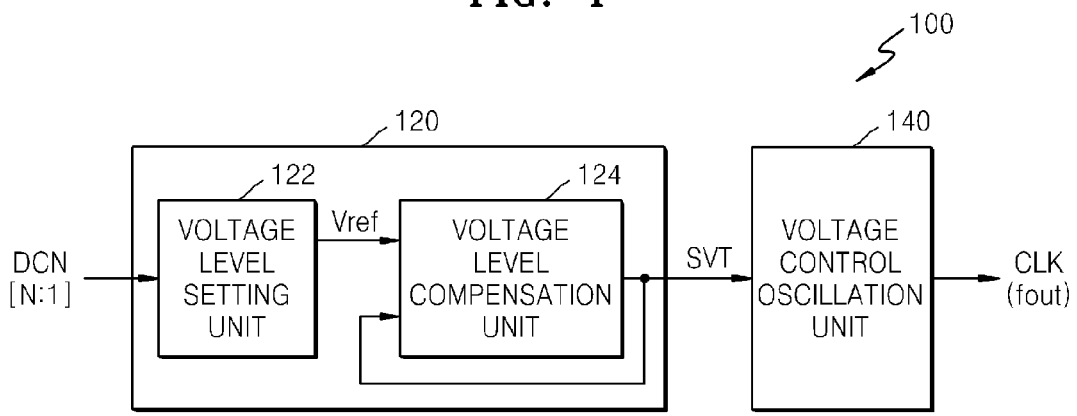

FIGS. 3 and 4 are diagrams of an electric power generation device of the digitally controlled oscillator 100 shown in FIG. 1 and FIG. 2. Referring to FIGS. 1 through 3, the current level setting unit 122 of the digital control unit 120 may output a reference current Iref, and a current level compensation unit 124 may output an output current SCR of a current source. In this case, the power control oscillator 140 may be a current control oscillator that is controlled by the output current SCR. The current control oscillator 140 of FIG. 3 may change the oscillation frequency fout according to a change in the output current SCR. The current control oscillator 140 may include, for example, a ring-type oscillator (not shown), in which unit delay cells having different delays according to currents supplied thereto are connected in series, as an oscillation circuit, wherein an output of a last unit delay cell is an input to a first unit delay cell among the unit delay cells. Each of the unit delay cells may delay an input by using an inverter or a differential amplifier. However, the embodiments of the present inventive concept are not limited thereto. Each of the unit delay cells may delay an input by using a register and a capacitor in some embodiments, or an inductor and a capacitor in other embodiments.

Referring to FIGS. 1, 2, and 4, a voltage level setting unit 122 of the digital control unit 120 may output a reference voltage Vref, and a voltage level compensation unit 124 may output an output voltage SVT of a voltage source. In this case, the power control oscillation unit 140 may be a voltage control oscillation unit that is controlled by the output voltage SVT. The voltage control oscillation unit 140 may change the oscillation frequency fout in response to a change of the output voltage SVT.

Figure 5:
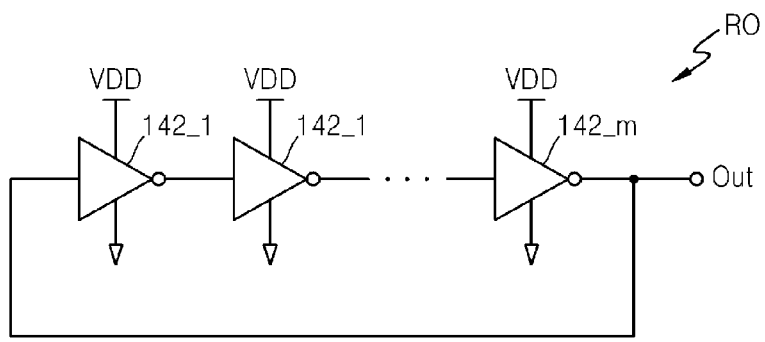
FIGS. 5 and 6 are diagrams of examples of a voltage control oscillation unit shown in FIG. 4.
Figure 6:
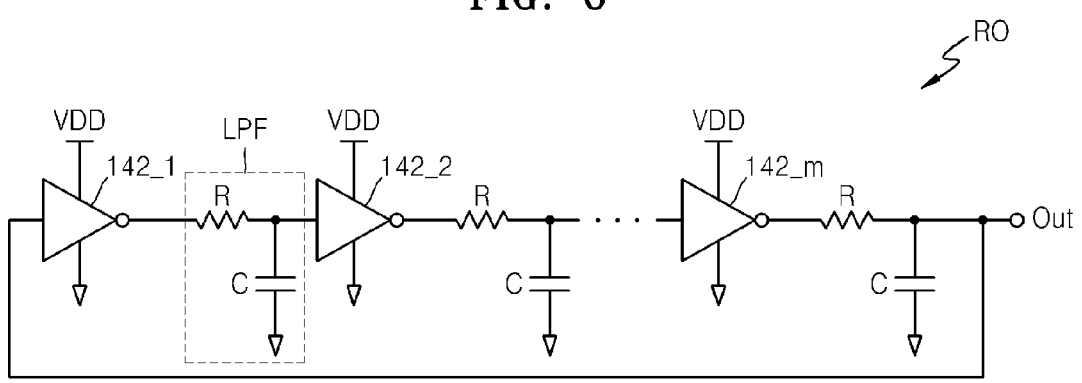

FIGS. 5 and 6 are diagrams of examples of the voltage control oscillation unit 140 of FIG. 4. Referring to FIGS. 4-6, the voltage control oscillation unit 140 includes a ring oscillator RO in which unit delay cells 142_1, 142_2, . . . , 142_m, e.g., inverters, are connected in series, for example, an odd number of unit delay cells 142_1, 142_2, . . . , 142_m. When a logic high H signal is an input of the ring oscillator RO, a logic low L signal is output from the odd number of unit delay cells 142_1, 142_2, . . . , 142_m. On the other hand, when the logic low L signal is an input of the ring oscillator RO, the logic high H signal is output from the odd number of unit delay cells 142_1, 142_2, . . . , 142_m. Since an output Out of the unit delay cells 142_1, 142_2, . . . , 142_m at the last terminal is an input of the unit delay cells 142_1, 142_2, . . . , 142_m at the first terminal, the ring oscillator RO generates an output having a waveform in which the logic high H signal and the logic low L signal are alternately shown.

The oscillation frequency fout can be determined according to a period of the output Out, that is, a period from the logic high H signal to a next logic high H signal. Since the delay of each of the unit delay cells 142_1, 142_2, . . . , 142_m varies depending on a power voltage VDD applied to each of the unit delay cells 142_1, 142_2, . . . , 142_m, the oscillation frequency fout may change when the period of the output is changed. The power voltage VDD shown in FIG. 5 is the output voltage SVT of FIG. 4. Various frequencies required by wireless communication using various channels may be generated by changing the oscillation frequency fout. Otherwise, a fed back oscillation frequency fout is changed in a manner that permits the oscillation frequency fout to maintain a constant value, and thus, operations may be performed stably. The ring oscillator RO shown in FIG. 6 can include an RC low pass filter (LPF) at an output end of each of the unit delay cells 142_1, 142_2, . . . , 142_m of the ring oscillator RO of FIG. 5 so as to remove ripple components that may be included in the output Out, and accordingly, the oscillation frequency fout may be accurately and stably generated.

Hereinafter, structures and operations of the digitally controlled oscillator 100 shown in FIG. 4, in which the electric power generated by the digitally controlled oscillator 100 is a voltage source, will be described for convenience of description. However, the embodiments of the present inventive concept are not limited thereto. Structures and operations of the digitally controlled oscillator 100 shown in FIG. 3 may be easily implemented by substituting the voltage source with for the current source in the digitally controlled oscillator 100 of FIG. 4 that will be described below. Also, hereinafter, it will be denoted that the output voltage SVT output from the digital control unit 120 includes a power voltage VDD. However, the output voltage SVT output from the digital control unit 120 is not limited to the power voltage VDD, and may be a voltage having a different voltage level as that of the power voltage VDD or used for other usages.

Figure 7:
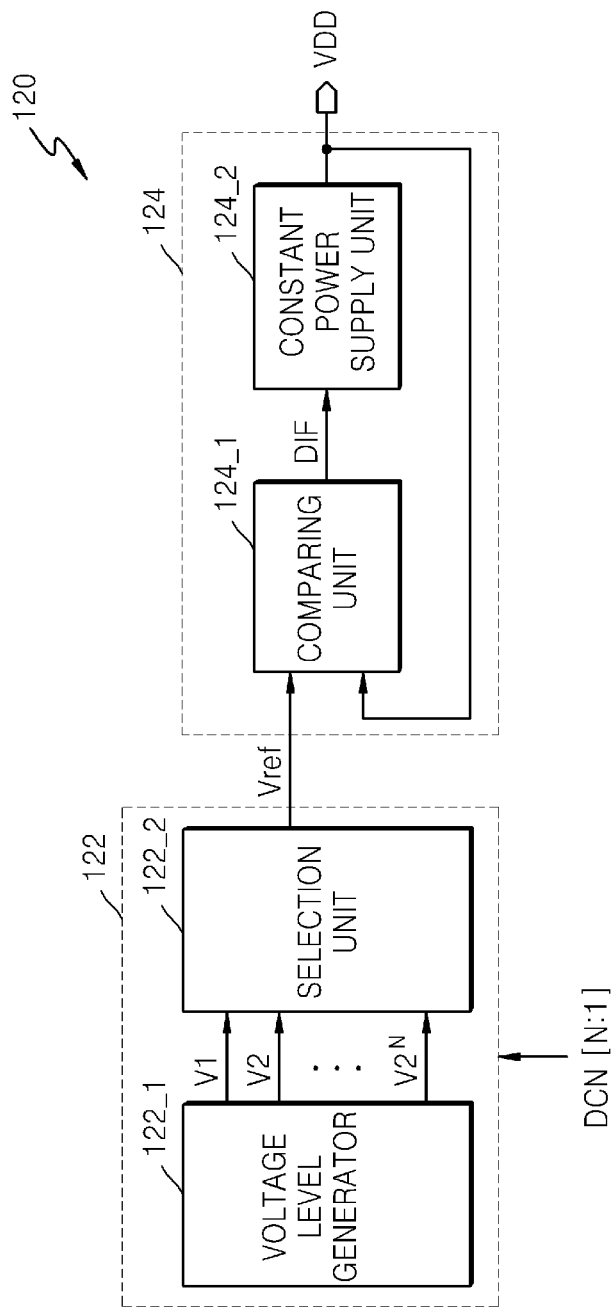
FIGS. 7 and 8 are diagrams of examples a digital control unit shown in FIG. 4.
Figure 8:
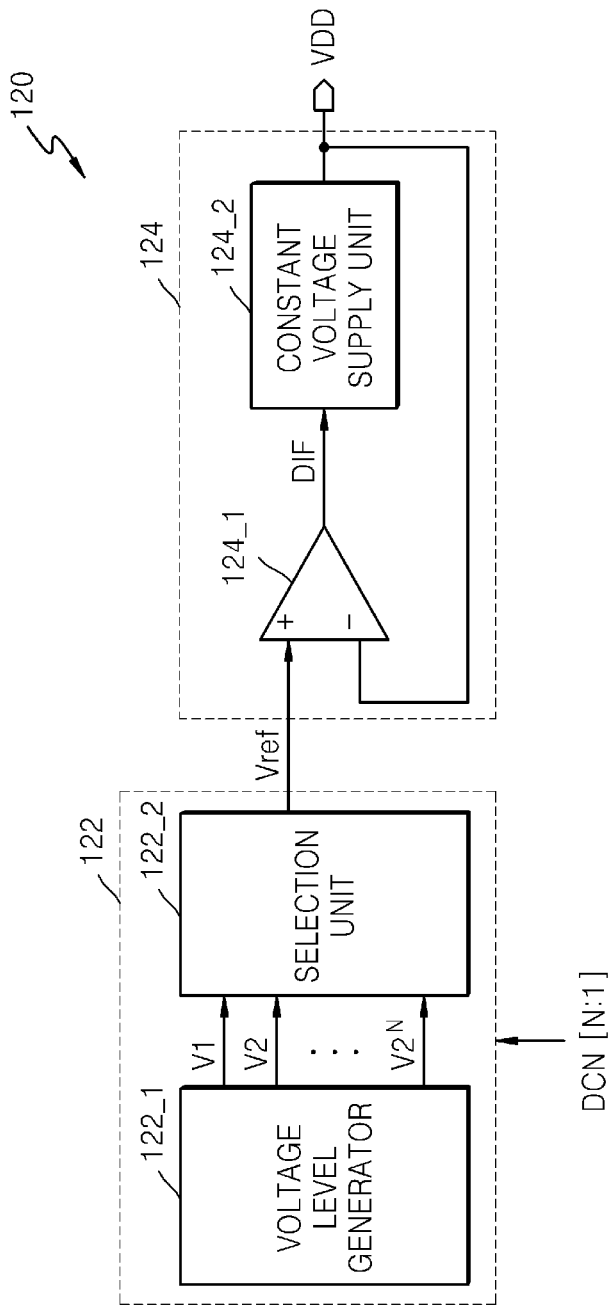

FIGS. 7 and 8 are diagrams of examples of the digital control unit 120 shown in FIG. 4. Referring to FIG. 7, a voltage level setting unit 122 of the digital control unit 120 may include a voltage level generator 122_1 and a selection unit 122_2. The voltage level setting unit 122 may include a plurality of unit level cells, the number of which is less than $2^N$, where N is the number of bits of the digital control signal DCN). Hereinafter, the number that is the same as a value of 2 raised to the power of N, where N is the number of bits of the digital control signal DCN ($2^N$) is represented as $2^N$. Examples of the unit level cells are described herein. The selection unit 122_2 is constructed to change a state of each of the unit level cells, e.g., off or on, in response to the digital control signal DCN to select the voltage level of the reference voltage Vref as one of the $2^N$ digital values.

The voltage level compensation unit 124 of the digital control unit 120 may include a comparing unit 124_1 and a constant power supply unit 124_2. The comparing unit 124_1 may compare the reference voltage Vref transmitted from the voltage level setting unit 122 and a feedback signal of the power voltage VDD, and output a difference value DIF in response to the comparison. For example, the comparing unit 124_1 may be a differential amplifier or the like, as shown in FIG. 8. In FIG. 8, the reference voltage Vref is input to a positive terminal of a differential amplifier 124_1, and the feedback signal of the power voltage VDD is input to a negative terminal of the differential amplifier 124_1. The differential amplifier 124_1 compares the reference voltage Vref with the feedback signal of the power voltage VDD, and outputs a difference value DIF.

The constant power supply unit 124_2 may supply the power voltage VDD after compensating for a difference value DIF between the reference voltage Vref and a feedback signal of the power voltage VDD. The constant voltage supply unit 124_2 maintains the power voltage VDD at a constant voltage level by adjusting a current amount according to the difference value DIF between the reference voltage Vref and the feedback signal of the power voltage VDD. For example, as shown in FIG. 8, the power voltage VDD that is output from the constant power supply unit 124_2 is input to the differential amplifier 124_1 in a reverse phase, that is, providing a negative feedback. Thus, if the difference value DIF between the reference voltage Vref and the feedback signal of the power voltage VDD has a positive value, then the reference voltage Vref is greater than the feedback signal of the power voltage VDD. Thus, the constant power supply unit 124_2 may operate with a current that is less than the reference current. However, if the difference value DIF between the reference voltage Vref and the feedback signal of the power voltage VDD has a negative value, then the reference voltage Vref is less than the feedback signal of the power voltage VDD. Thus, the positive power supply unit 124_2 can operate with a current that is greater than the reference current.

The voltage level compensation unit 124 generates the power voltage VDD at the same voltage level as that of the reference voltage Vref according to the above operations. As described above, the power voltage VDD generated by the digital control unit 120 shown in FIGS. 7 and 8 is generated as one of the $2^N$ voltage levels.

Figure 9:
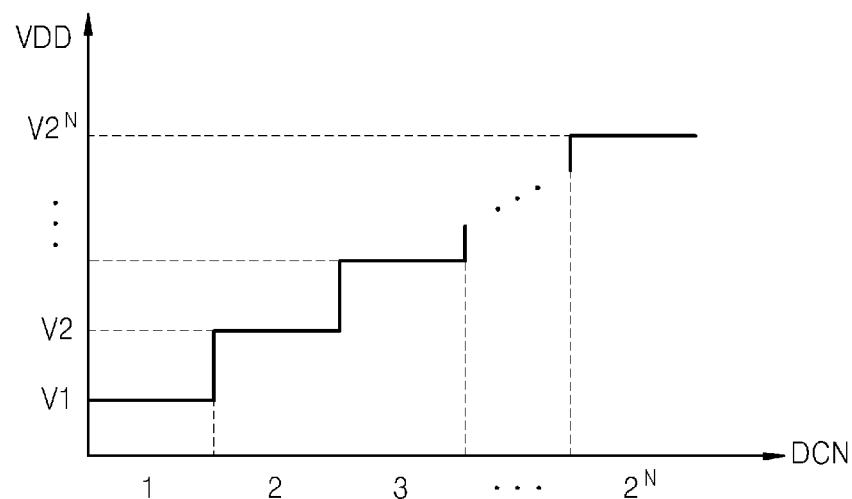
FIG. 9 is a diagram of an example of a voltage level of a power voltage shown in FIGS. 7 and 8.

FIG. 9 is a graph of an example of the voltage level of the power voltage VDD shown in FIGS. 7 and 8. Referring to FIGS. 1, 7, and 8, the power voltage VDD output from the digital control unit 120 that controls the oscillation frequency fout of the output clock CLK increases when a digital value of the digital control signal DCN input to the digital control unit 120 increases. For example, if the digital control signal DCN has a first value 1, then the power voltage VDD is output as a first voltage level V1, and if the digital control signal DCN has a second value 2 that is greater than the first value 1, then the power voltage VDD is output as a second voltage level V2 that is greater than the first voltage level V1. Also, the voltage levels V1, V2, . . . , V$2^N$ of the power voltage VDD may correspond to the digital values respectively of the digital control signal DCN, i.e., $2^N$ digital values.

Figure 10:
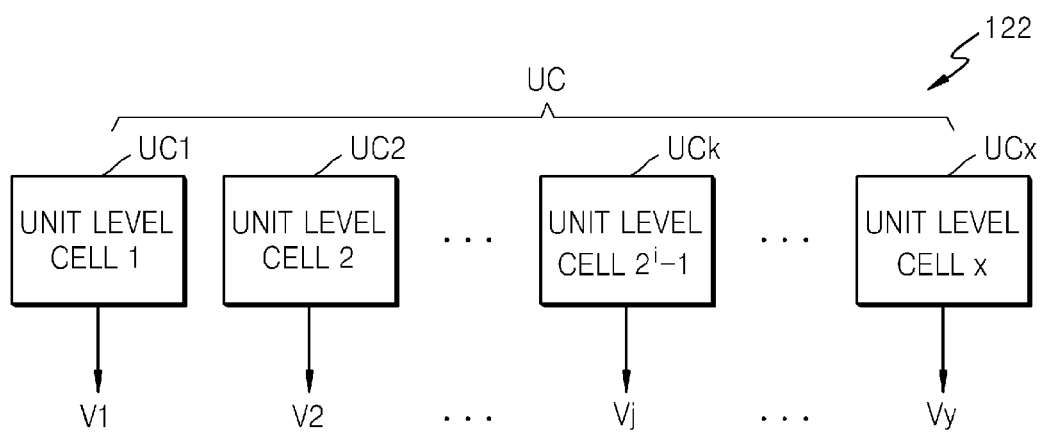
FIG. 10 is a diagram of an example of a plurality of unit level cells included in a voltage level setting unit in the digital control unit shown in FIG. 4.
Figure 11:
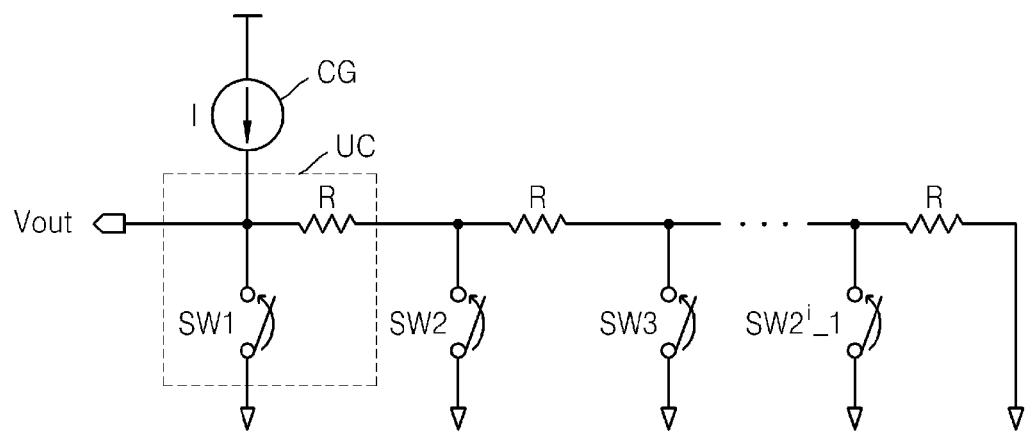
FIGS. 11 and 12 are diagrams of unit level cells, in accordance with other embodiments.
Figure 12:
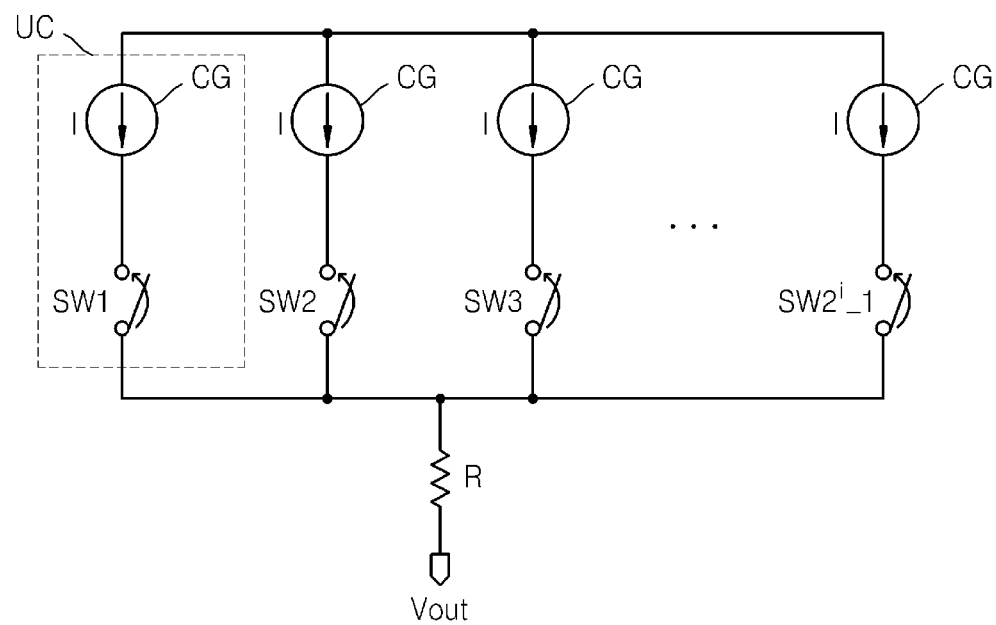

FIG. 10 is a diagram of an example of a plurality of unit level cells UC included in the voltage level setting unit 122 of the digital control unit 120 shown in FIG. 4. FIGS. 11 and 12 are diagrams of unit level cells, in accordance with other embodiments. Referring to FIGS. 4 and 10, a digital control unit 120 includes a number (x) of unit level cells UC. The x number of unit level cells UC may be connected to each other in series or parallel. Each of the unit level cells UC corresponds to a reference voltage Vref, or to an arbitrary voltage level of the power voltage VDD. For example, a first unit level cell UC1 may correspond to the reference voltage Vref or a first voltage level V1 of the power voltage VDD, and a second unit level cell UC2 may correspond to the reference voltage Vref or a second voltage level V2 of the power voltage VDD, and so on. The first voltage level V1 and the second voltage level V2 of FIG. 10 may be the same as or different from the first voltage level V1 and the second voltage level V2 of FIG. 9.

A unit level cell UC may be realized in various forms. For example, FIG. 11 shows unit level cells UC connected to a current source CG that supplies a current I. The unit level cell UC shown in FIG. 11 may include a resistor R and a switch SW connected to a ground voltage. The resistors R included in the unit level cells UC may have the same resistance values to output a stabilized and accurate voltage Vout. The switch SW of each of the unit level cells UC is turned on or turned off in response to a signal that controls the switch SW, for example, a digital value of the digital control signal DCN.

For example, if there are three unit level cells UC and a digital value of the digital control signal DCN is 00, then each of the switches in the unit level cells is turned off, and the output voltage Vout may be set to a voltage level of 3RI. If there are three unit level cells UC and a digital value of the digital control signal DCN is 10, then the switches SW of two unit level cells UC that are adjacent to the ground voltage are turned off and the switch SW of the other unit level cell UC is turned on. Thus, the output voltage Vout may be set to have a voltage level of RI. Otherwise, if there are three unit level cells UC and a digital value of the digital control signal DCN is 11, then the switches SW of the unit level cells UC are turned on, and the output voltage Vout may be set to have a voltage level of 0.

However, even if the switches of all unit level cells UC are turned on, the output voltage Vout may be output at a voltage level other than 0, by changing locations of the switches SW in the unit level cells UC of FIG. 11. Unlike the unit level cells UC shown in FIG. 11, each of the unit level cells UC shown in FIG. 12 may include a current source CG that supplies a current I and a switch SW. The current sources CG in the unit level cells UC of FIG. 12 may have the same current driving capacities in order to output stabilized and accurate output voltages Vout. The manner in which a setting of the voltage levels by switching, i.e., turning-on/turning-off, the unit level cells UC of FIG. 12 occurs can be the same as or similar to those of FIG. 11, and thus detailed descriptions thereof are not provided here.

The number of unit level cells of FIG. 10, included in the voltage level setting unit 122 of the digital control unit 120 shown in FIG. 4, that is, x, may be $2^N-1$ that is less than $2^N$, where N is the number of bits of the digital control signal DCN, by one. For example, the voltage level generator 122_1 of the digital control unit 120 shown in FIGS. 7 and 8 may include $2^N-1$ unit level cells UC. The voltage level generator 122_1 may set the voltage level as one of the $2^N$ voltage levels in FIG. 9, for example, by activating or deactivating switches or the like, with respect to each of the $2^N-1$ unit level cells UC. As described above, there is a voltage level corresponding to a case where all the unit level cells UC are turned on, and thus, the $2^N-1$ unit level cells UC are necessary with respect to the $2^N$ voltage levels, even when each of the unit level cells UC corresponds to one voltage level.

The changing of states, i.e., tuning-on/turning-off, of each of the unit level cells UC included in the voltage level generator 122_1 shown in FIGS. 7 and 8 may be dependent upon the digital control signal DCN. That is, the digital control unit 120 shown in FIGS. 7 and 8 turns on or turns off each of the $2^N-1$ unit level cells UC according to the digital control signal DCN of N bits, which is input to have one of the $2^N$ digital values, and thus, sets the reference voltage Vref as one of the $2^N$ voltage levels. The voltage level compensation unit 124 of the digital control unit 120 shown in FIGS. 7 and 8 may output the power voltage VDD at the voltage level of the reference voltage Vref. Therefore, the power voltage VDD generated by the digital control unit 120 shown in FIGS. 7 and 8 may be set as one of the $2^N$ voltage levels shown in FIG. 9.

As described above, when the oscillation frequency fout is controlled by the digital control signal DCN of N bits, the oscillation frequency fout may be set as one of the $2^N$ frequencies. The oscillation frequency fout is sensitive to the variation of the power voltage VDD. Therefore, the power voltage VDD has to be stably and accurately generated. To do this, each of the unit level cells UC of the digital control unit 120 corresponds to a voltage level of a power voltage VDD.

The digital control unit 120, including the unit level cells UC, the number of which corresponds to the number of voltage levels ($2^N-1$) so that each of the unit level cells corresponds to one voltage level of the power voltage VDD, is described above. Hereinafter, the digitally controlled oscillator 100 having a resolution of $2^N$ in which each of the unit level cells may correspond to one voltage level of the power voltage VDD even when less than $2^N-1$ unit delay cells less are formed, and capable of stably and accurately generating the oscillation frequency while reducing a layout area.

Figure 13:
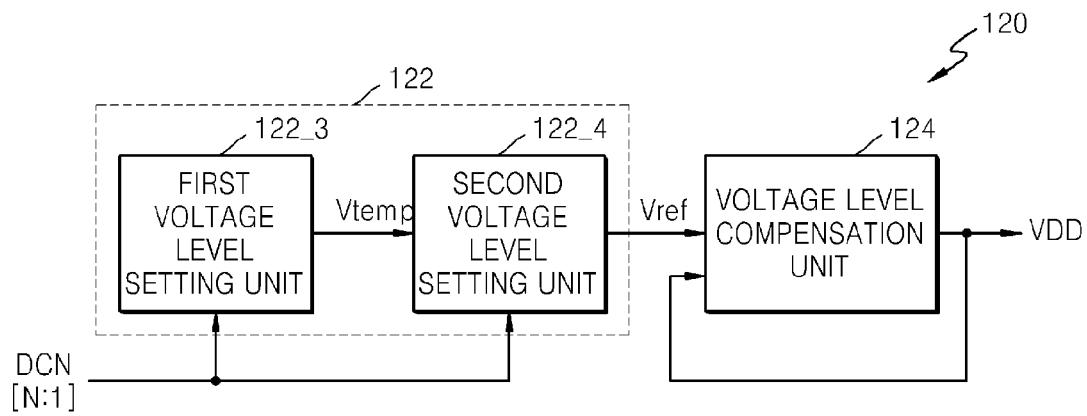
FIGS. 13 and 14 are diagrams of other examples of the digital control unit shown in FIG. 4.
Figure 14:
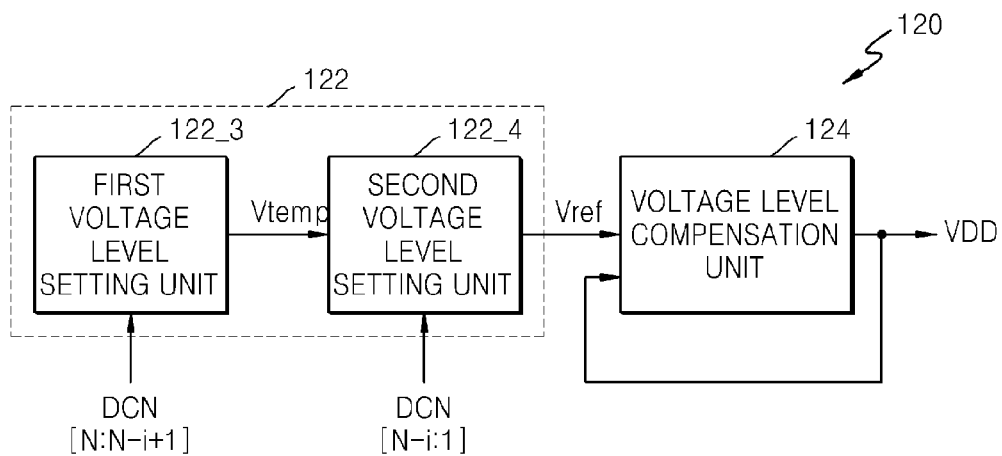

FIGS. 13 and 14 are diagrams of other examples of the digital control unit 120 of FIG. 4. Referring to FIG. 13, the digital control unit 120 according to the present embodiment may include a voltage level setting unit 122 and a voltage level compensation unit 124. The voltage level setting unit 122 may set a voltage level of the reference voltage Vref in response to a digital control signal DCN. The voltage level compensation unit 124 may compensate for the difference between the reference voltage Vref and the feedback signal of the power voltage VDD.

The voltage level setting unit 122 of FIG. 13 may include a first voltage level setting unit 122_3 and a second voltage level setting unit 122_4. The first voltage level setting unit 122_3 may output a temporary reference voltage Vtemp in response to a first bit location value of the digital control signal DCN. The second voltage level setting unit 122_4 may modulate the voltage level of the temporary reference voltage Vtemp and output the modulated voltage level as the reference voltage Vref in response to a second bit location value of the digital control signal DCN.

The first bit location value of the digital control signal DCN can be a value represented by a certain number of upper bits in the digital control signal DCN. The second bit location value of the digital control signal DCN may be a value represented by remaining bits except for a predetermined number of upper bits in the digital control signal DCN. For example, in the digital control signal DCN, the first bit location value and the second bit location value may be, as shown in FIG. 14, an upper bit value (DCN[N:N−i+1]) and a lower bit value (DCN[N−i:1]) of the digital control signal DCN. For example, the number of bits (N) of the digital control signal DCN may be 3, and the upper bit value (DCN[N:N−i+1]) of the digital control signal DCN may be a value represented by upper two bits (i=1). For example, the upper bit value (DCN[N:N−i+1]) of the digital control signal DCN may be DCN[3:2]. Thus, for example, if the digital control signal DCN is applied as 101, then the upper bit value (DCN[N:N−i+1]) of the digital control signal DCN, that is, the first bit location value applied to the first voltage level setting unit 122_3, may be 10.

In another example, if the number of bits (N) of the digital control signal DCN is 3 and the upper bit value (DCN[N:N−i+1]) of the digital control signal DCN is a value represented by upper two bits (i=1), then the lower bit value (DCN[N−i:1]) of the digital control signal DCN may be a value represented by the lower one bit. For example, if the upper bit value (DCN[N:N−i+1]) of the digital control signal DCN is DCN[3:2], the lower bit value (DCN[N−i:1]) of the digital control signal DCN may be DCN[1:1]. In addition, if the digital control signal DCN is applied as 101 and the upper bit value (DCN[N:N−i+1]) of the digital control signal DCN is 10, then the lower bit value (DCN[N−i:1]) of the digital control signal DCN, that is, the second bit location value applied to the second voltage level setting unit 122_4, may be 1.

Examples are described below where the first bit location value and the second bit location value of the digital control signal DCN are the upper bit value (DCN[N:N−i+1]) and the lower bit value (DCN[N−i:1]), respectively, of the digital control signal.

Referring again to FIG. 13, a sum (x) of the number of unit level cells UC shown in FIG. 10 and included in the first voltage level setting unit 122_3 and the second voltage level setting unit 122_4 may be less than $2^N-1$. For example, the first voltage level setting unit 122_3 may include $2^i-1$ unit level cells UC, the second voltage level setting unit 122_4 may include $x-2^i-1$ unit level cells UC, and a sum of the number of unit level cells UC included in the first and second voltage level setting units 122_3 and 122_4 may be x.

Figure 15:
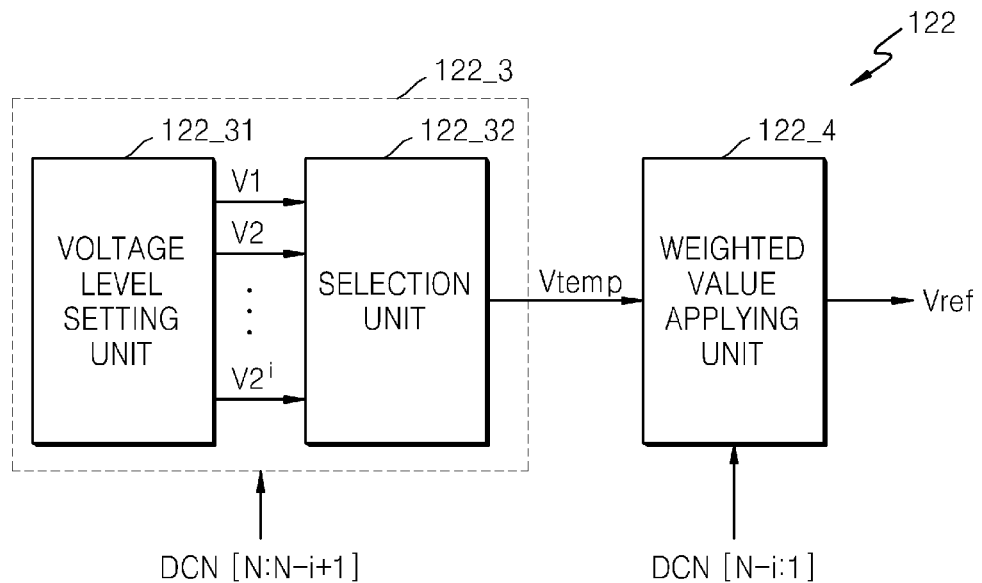
FIG. 15 is a diagram of an example of a voltage level setting unit shown in FIG. 14.

FIG. 15 is a diagram of an example of a voltage level setting unit 122 shown in FIG. 14. Referring again to FIG. 14, the first voltage level setting unit 122_3 may set one of the voltage levels corresponding to the number of upper bits in the digital control signal DCN as a voltage level of the temporary reference voltage Vtemp. For example, if the number of upper bits in the digital control signal DCN is i, then the first voltage level setting unit 122_3 may set one of the $2^i$ voltage levels (V1, V2, . . . , V2$^i$) as the voltage level of the temporary reference voltage Vtemp. For example, the first voltage level setting unit 122_3 may include $2^i-1$ unit level cells, the number of which is less than $2^i$, where i is the number of upper bits in the digital control signal DCN. Hereinafter, the number that is the same as a value obtained by raising 2 to the power of i, that is, the number of upper bits in the digital control signal DCN, may be expressed as $2^i$.

The first voltage level setting unit 122_3 may include a voltage level generator 122_31 and a selection unit 122_32. In the above example, there may be $2^i-1$ unit level cells UC. For example, the voltage level generator 122_31 may include $2^i-1$ unit level cells UC having a structure shown in FIG. 11.

The selection unit 122_32 turns on or off the $2^i-1$ unit level cells in response to the digital control signal DCN to select the voltage level of the temporary reference voltage Vtemp as one of the $2^i$ voltage levels.

Referring to FIG. 15, the second voltage level setting unit 122_4 may be a weighted value adding unit 122_4. The weighted value adding unit 122_4 may add one weighted value corresponding to a number of lower bits in the digital control signal DCN to the temporary reference voltage Vtemp applied from the first voltage level setting unit 122_3, and then, set the weighted value as the voltage level of the reference voltage Vref. For example, if the number of lower bits of the digital control signal DCN is j, the number of weighted values may be $2^j$. For example, the second voltage level setting unit 122_4 may include unit level cells UC having the structure shown in FIG. 12 in order to apply the $2^j$ of weighted values to the temporary reference voltage Vref. The weighted values may be set by turning on or turning off the switch SW in each of the unit level cells UC shown in FIG. 12 according to the lower bit value (DCN [N−i:1]) of the digital control signal DCN.

For example, the second voltage level setting unit 122_4 may apply a weighted value corresponding to the lower bit value (DCN[N−i: 1]) of the digital control signal DCN to the temporary reference voltage Vref applied as a first voltage level V1. For example, if the number of lower bits in the digital control signal DCN is 2, then one of four weighted values may be applied to the temporary reference voltage Vtemp. In this case, if a difference between the first voltage level V1 and the second voltage level V2 is 1, then the four weighted values may be respectively 1, 1.25, 1.5 and 1.75.

In this case, the second voltage level setting unit 122_4 may include three unit level cells UC shown in FIG. 12, and may apply a weighted value 1 to the temporary reference voltage Vtemp by turning off the switches SW of all unit level cells UC in response to the lower bit value (DCN[N−i:1]) of the digital control signal DCN, that is, 00. Although the voltage level setting unit may be set to output the voltage Vout as a 0 value when the switches of all unit level cells UC are turned off in FIG. 12, the output voltage Vout may be set as 1 by connecting electric power to the resistor R.

Figure 16:
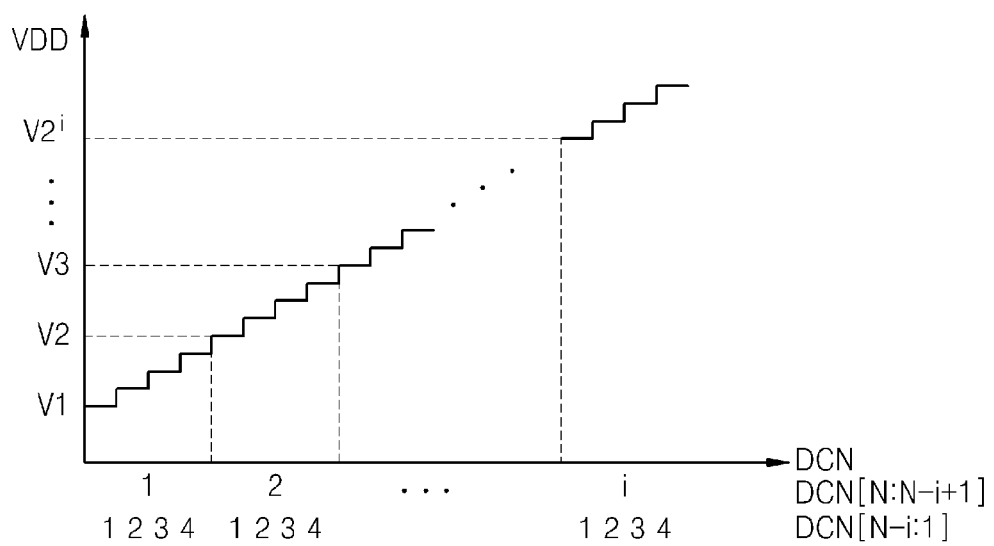
FIG. 16 is a diagram of an example of a voltage level of a power voltage shown in FIG. 15.

According to the above description, the second voltage level setting unit 122_4 may generate fine voltage levels corresponding to the number of lower bits between the two voltage levels of the temporary reference voltage Vtemp, for example, as shown in FIG. 16.

Therefore, the voltage level setting unit 122 may apply $2^j$ weighted values to each of the $2^i$ voltage levels of the temporary reference voltage Vtemp by using the second voltage level setting unit 122_4, and thus, the power voltage VDD may be set to have one of the voltage levels, in particular $2^i \times 2^j$ voltage levels. As described above, since the first bit location value, i.e., upper bit value, of the first digital control signal DCN is the value represented by the certain number of upper bits of the digital control signal DCN and the second bit location value, i.e., lower bit value, of the second digital control signal DCN is the value represented by the remaining bits except for the predetermined number of upper bits of the digital control signal DCN, the number of bits (N) of the digital control signal DCN may be the same as i+j.

Therefore, the number of voltage levels of the power voltage VDD, which may be set by the voltage level setting unit 122 shown in FIG. 15, that is, the value of $2^i \times 2^j$, may be the same as $2^N$. Therefore, the voltage level setting unit 122 may realize the same resolution by the unit level cells, the number of which is less than $2^N-1$, and thus, the layout area may be reduced.

The reference voltage Vref set by the voltage level setting unit 122 shown in FIG. 15 is applied to the voltage level compensation unit 124 shown in FIG. 14. The voltage level compensation unit 124 may include the comparing unit 124_1 and the constant power supply unit 124_2 shown in FIG. 8. Therefore, the current may be adjusted according to the difference value DIF generated by the comparing unit 124_1 between the reference voltage Vref transmitted from the voltage level setting unit 122 and the feedback signal of the power voltage VDD, and thus, the power voltage VDD may be maintained at a constant voltage level. The voltage level compensation unit 124 may allow the power voltage VDD to be generated at the same voltage level as that of the reference voltage Vref through one or more of the above operations.

Figure 17:
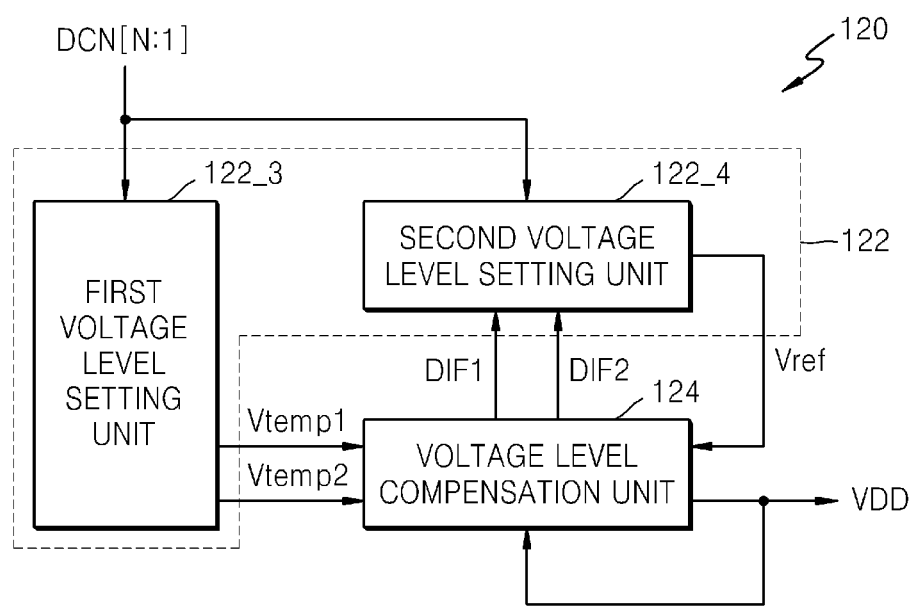
FIG. 17 is a diagram of another example of the digital control unit shown in FIG. 4.

FIG. 17 is a diagram of another example of the digital control unit 120 shown in FIG. 4. Referring to FIG. 17, the digital control unit 120 may include a voltage level setting unit 122 and a voltage level compensation unit 124. The voltage level setting unit 122 may set the voltage level of the reference voltage Vref in response to the digital control signal DCN. The voltage level compensation unit 124 may compensate for the difference between the reference voltage Vref and the feedback signal of the power voltage VDD.

The voltage level setting unit 122 shown in FIG. 17 may include the first voltage level setting unit 122_3 and the second voltage level setting unit 122_4. The first voltage level setting unit 122_3 may output temporary reference voltages at different voltage levels among a plurality of voltage levels, the number of which corresponds to the first bit location value of the digital control signal DCN. Hereinafter, the temporary reference voltages output at two voltage levels may be referred to as a first temporary reference voltage Vtemp1 and a second temporary reference voltage Vtemp2.

The second voltage level setting unit 122_4 may modulate the voltage levels of the first and second temporary reference voltages Vtemp1 and Vtemp2 in response to the second bit location value of the digital control signal DCN, and output the modulated voltage as the reference voltage Vref. The second voltage level setting unit 122_4 may output a voltage level that is obtained by summing a voltage level obtained by applying a first coefficient to a first difference value DIF1 corresponding to the difference between the first temporary reference voltage Vtemp1 and the feedback signal of the power voltage VDD and a voltage level obtained by applying a second coefficient to a second difference value DIF2 corresponding to the difference between the second temporary reference voltage Vtemp2 and the feedback signal of the power voltage VDD, as the voltage level of the reference voltage Vref.

A sum (x) of the number of unit level cells UC, shown in FIG. 10 included in the first voltage level setting unit 122_3 and the second voltage level setting unit 122_4 shown in FIG. 17 may be less than $2^N-1$. For example, the first voltage level setting unit 122_3 may include $2^i-1$ unit level cells UC and the second voltage level setting unit 122_4 may include $x-2^i-1$ unit level cells UC. Accordingly, the sum of the unit level cells UC included in the first and second voltage level setting units 122_3 and 122_4 may be x, which is less than $2^N-1$.

Figure 18A:
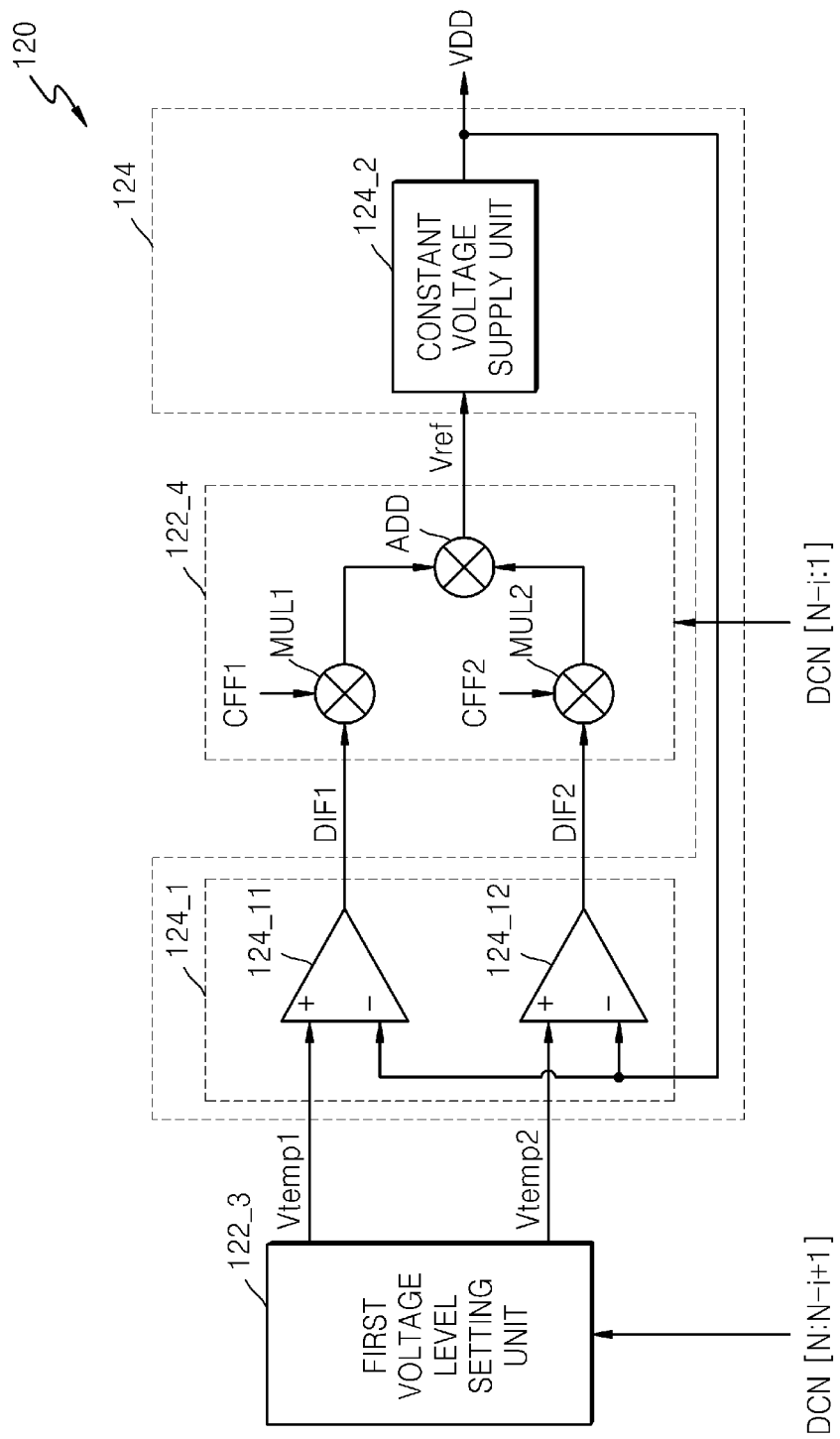
FIG. 18A is a diagram of an example of a digital control unit shown in FIG. 17.

FIG. 18A is a diagram of an example of the digital control unit 120 of FIG. 17. Referring to FIG. 18A, the first bit location value of the digital control signal DCN applied to the first voltage level setting unit 122_3 may be a value represented by a predetermined number of upper bits in the digital control signal DCN. In addition, the second bit location value of the digital control signal DCN applied to the second voltage level setting unit 122_4 may be a value represented by one or more remaining bits except for a predetermined number of upper bits in the digital control signal DCN. The first bit location value and the second bit location value of the digital control signal DCN may be an upper bit value (DCN[N:N−i+1]) and a lower bit value (DCN[N−i:1]), respectively, of the digital control signal DCN, for example, described above. Examples where the first and second bit location values of the digital control signal DCN include the upper bit value (DCN[N:N−i+1]) and the lower bit value (DCN[N−i:1]), respectively, of the digital control signal DCN will be described below.

Figure 19:
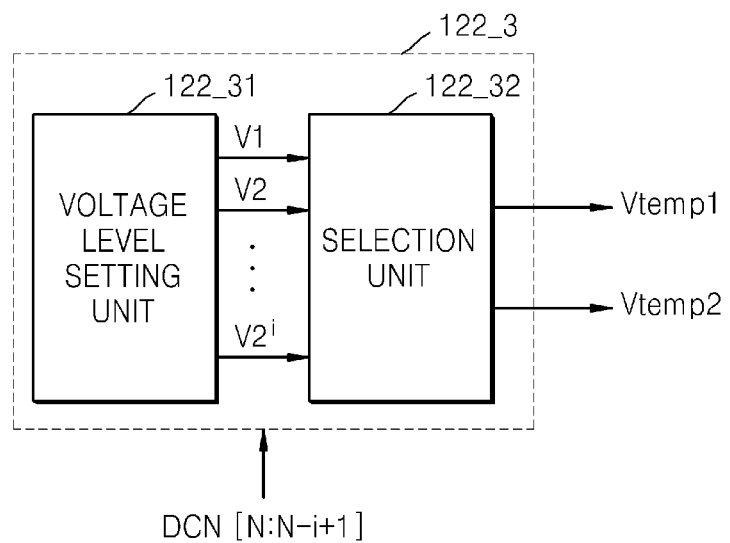
FIGS. 19 through 21 are diagrams of examples of a first voltage level setting unit shown in FIG. 18A.
Figure 20:
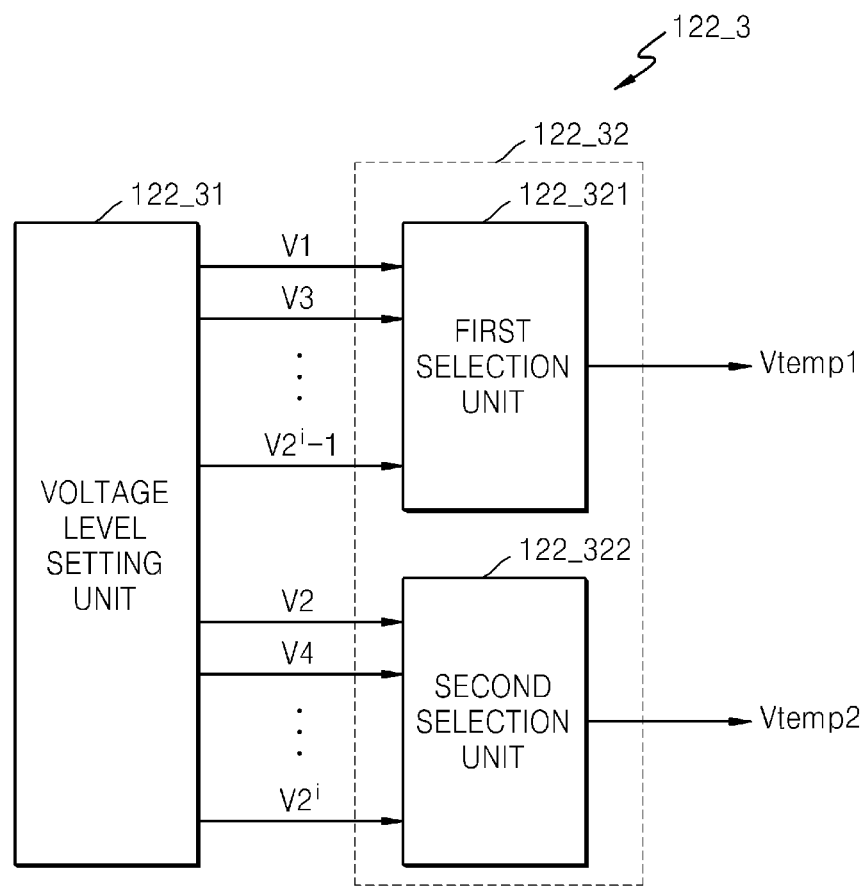

FIG. 19 is a diagram of an example of the first voltage level setting unit 122_3 shown in FIG. 18A. Referring to FIGS. 18A and 19, the first voltage level setting unit 122_3 may output two voltage levels corresponding to a number of upper bits of the digital control signal DCN as a first temporary reference voltage Vtemp1 and a second temporary reference voltage Vtemp2, respectively. For example, if the number of upper bits in the digital control signal DCN is i, then the first voltage level setting unit 122_3 may output two voltage levels from among $2^i$ voltage levels (V1, V2, ..., V2$^i$) as the first and second temporary reference voltages Vtemp1 and Vtemp2, respectively. For example, the first voltage level setting unit 122_3 may include $2^i-1$ unit level cells that is less than the number of $2^i$ (i is the number of upper bits in the digital control signal DCN) by one. Hereinafter, the number that is the same as a value obtained by raising 2 to the power of i, that is, the number of upper bits in the digital control signal DCN, is simply expressed as $2^i$.

The first voltage level setting unit 122_3 may include a voltage level generator 122_31 and a selection unit 122_32. In the above example, the voltage level generator 122_31 may include $2^i-1$ unit level cells UC. For example, the voltage level generator 122_31 may include $2^i-1$ unit level cells UC having a structure similar to or the same as that shown in FIG. 11. The selection unit 122_32 may select two of the $2^i$ voltage levels as the first and second temporary reference voltages Vtemp1 and Vtemp2 by turning on or turning off the $2^i-1$ unit level cells in response to the upper bits of the digital control signal DCN.

Embodiments of the present inventive concept are not limited to the foregoing.

Figure 21:
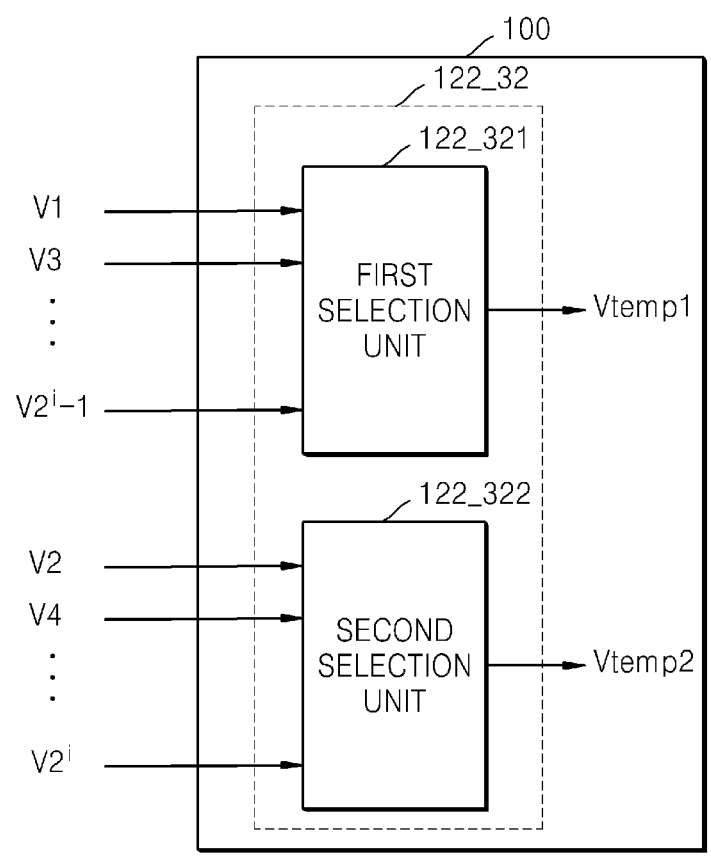

As shown in FIG. 21, another example of the first voltage level setting unit 122_3 of FIG. 18A can be provided, where a selection unit 122_32 of a first voltage level setting unit 122_3 may include a first selection unit 122_321 and a second selection unit 122_322 for selecting the first and second temporary reference voltages Vtemp1 and Vtemp2, respectively. The first selection unit 122_321 may select one of the voltage levels of a first group as the first temporary reference voltage Vtemp1. The second selection unit 122_322 may select one of the voltage levels of a second group as the second temporary reference voltage Vtemp2. For example, the voltage levels of the first group may be an odd-number of voltage levels in FIG. 16, and the voltage levels of the second group be an even-number of voltage levels in FIG. 16. The example in which the voltage level setting unit includes the voltage level generator is described above. However, the embodiments of the present inventive concept are not limited thereto. As shown in FIG. 21 showing another example of the first voltage level setting unit 122_3 of FIG. 18A, the plurality of voltage levels V1, V2, ..., V2$^{i-1}$, and V2$^i$ may be applied from a source external to the digital control oscillator 100.

Referring back to FIG. 18A, the second voltage level setting unit 122_4 may include an interpolator. The interpolator 122_4 may output a voltage level calculated by summing a voltage level obtained by applying a first coefficient CFF1 to a first difference value DIF1 corresponding to a difference between the first temporary reference voltage Vtemp1 and a feedback signal of the power voltage VDD and a voltage level obtained by applying a second coefficient CFF2 to a second difference value DIF2 corresponding to a difference between the second temporary reference voltage Vtemp2 and a feedback signal of the power voltage VDD, as a voltage level of the reference voltage Vref. The interpolator 122_4 of FIG. 18A may include a first multiplier MUL1 that multiplies the first difference value DIF1 by the first coefficient CFF1, a second multiplier MUL2 multiplying the second difference value DIF2 by the second coefficient CFF2, and an adder ADD that adds outputs of the first multiplier MUL1 and the second multiplier MUL2, respectively, and outputs the addition result as the reference voltage Vref.

Figure 18B:
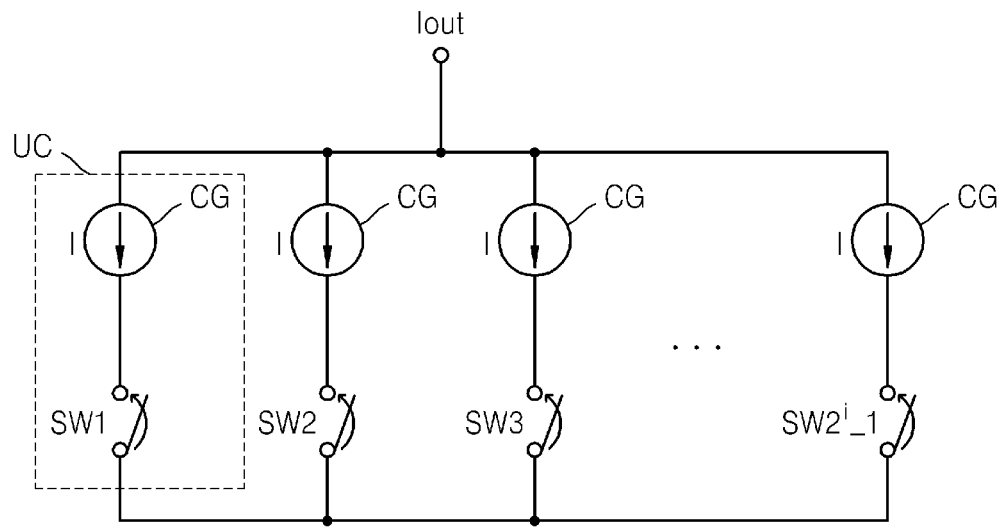
FIG. 18B is a diagram of an example of setting a first coefficient and a second coefficient of FIG. 18A.

The first coefficient CFF1 and the second coefficient CFF2 may be set to a number corresponding to a number of lower bits in the digital control signal DCN. For example, if the number of lower bits in the digital control signal DCN is j, there may be $2^j$ first coefficients CFF1 and second coefficients CFF2. For example, the second voltage level setting unit 122_4 may include the unit level cells UC having the structure shown in FIG. 18B, in order to apply the first coefficients CFF1 and second coefficients CFF2 to the first and second temporary reference voltages Vtemp1 and Vtemp2. Referring to FIGS. 18A and 18B, by turning on or turning off the switches SW in the unit level cells UC according to a lower bit value (DCN[N−i:1]) of the digital control signal DCN, the first coefficients CFF1 and the second coefficients CFF2 of the interpolator 122_4 may be set. The first coefficients CFF1 and the second coefficients CFF2 may be the same or different. The method of setting the first and second coefficients CFF1 and CFF2 by turning on or turning off the switches SW of the unit level cells UC of FIG. 18B can be similar to the above descriptions, and detailed descriptions thereof are omitted here. Although not shown in FIG. 18B, the interpolator 122_4 may further include a logic for converting a set current Iout into the reference voltage Vref according to a changing of a state, i.e., turning on/turning off, of the switches SW in the unit level cells UC.

In some embodiments, a sum of the first coefficient CFF1 and the second coefficient CFF2 is 1. Therefore, the voltage level of the power voltage VDD set by the second voltage level setting unit 122_4 may be one of a plurality of classified voltage levels corresponding to the number of lower bits between the two voltage levels as shown in FIG. 16. Therefore, the voltage level setting unit 122 may apply $2^j$ of weighted values to each of $2^i$ voltage levels via the second voltage level setting unit 122_4. Thus, the power voltage VDD may be set as one of $2^i \times 2^j$ voltage levels. As described above, the number of bits of the digital control signal DCN may be the same as a value of i+j. Therefore, the number of voltage levels of the power voltage VDD, that is, $2^i \times 2^j$, set by the voltage level setting unit 122 of FIG. 18A may be the same as $2^N$. Thus, the voltage level setting unit 122 may realize the same resolution by using the unit level cells UC, the number of which is less than $2^N-1$. Accordingly, the layout area may be reduced, since a number of unit level cells UC corresponding to each voltage level for realizing a same resolution is reduced according to one or more embodiments herein.

Also, the first and second coefficients CFF1 and CFF2 may be set to linearly change with respect to the lower bit value (DCN[N−i:1]) of the digital control signal DCN. Therefore, since the power voltage VDD may linearly change in a voltage range corresponding to the difference between the first temporary reference voltage Vtemp1 and the second temporary reference voltage Vtemp2, the power voltage VDD may have a monotone increasing or monotone decreasing characteristic. Therefore, the oscillation frequency fout may be generated in a stable manner Here, 'linear' denotes a monotone increase or monotone decrease in a corresponding range.

The reference voltage Vref set by the interpolator 122_4 of FIG. 18A is applied to the voltage level compensation unit 124. The voltage level compensation unit 124 may include a first comparing unit 124_11, a second comparing unit 124_12, and a constant voltage supply unit 124_2. The first comparing unit 124_11 and the second comparing unit 124_12 receive the first temporary reference voltage Vtemp1 and the second temporary reference voltage Vtemp2, respectively, from the voltage level compensation unit 124, and output the first difference value DIF1 and the second difference value DIF2 by comparing the received voltages with the feedback signal of the power voltage VDD. The first difference value DIF1 and the second difference value DIF2 are applied at the interpolator 122_4. The constant voltage supply unit 124_2 maintains the power voltage VDD at a constant voltage level by adjusting the current according to the reference voltage Vref applied from the interpolator 122_4. The voltage level compensation unit 124 generates the power voltage VDD at the same voltage level as that of the reference voltage Vref according to one or more of the above-described operations.

Figure 22:
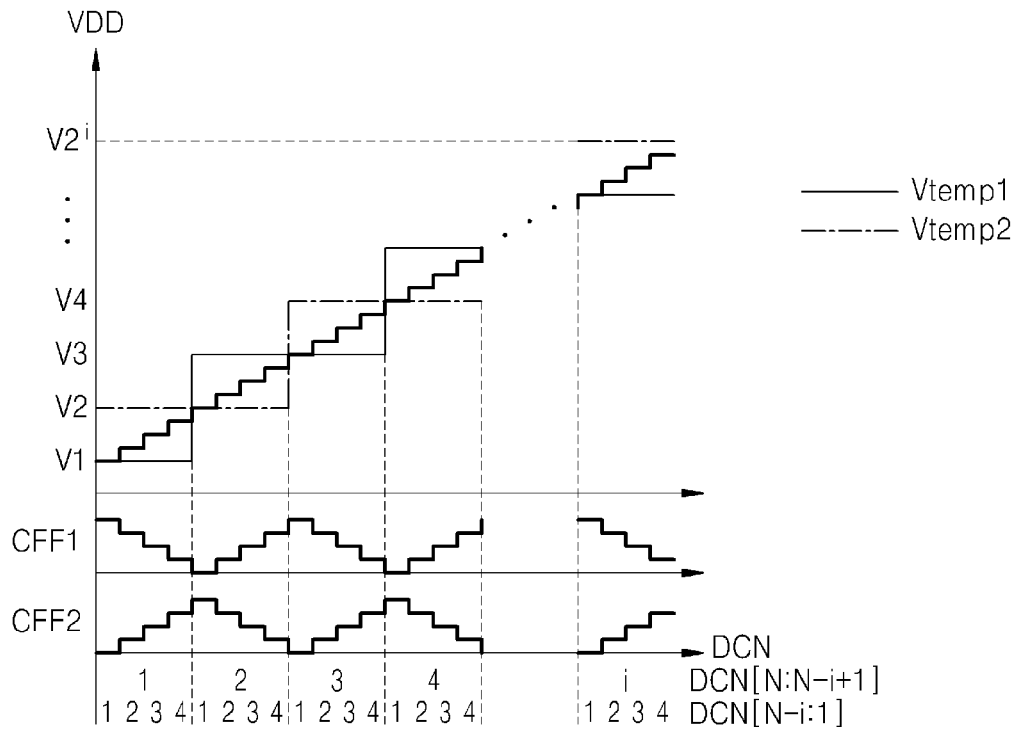
FIG. 22 is a diagram illustrating a relationship between a first coefficient and a second coefficient of the digital control unit of FIG. 18A.

FIG. 22 is a diagram illustrating a relationship between a first coefficient CFF1 and a second coefficient CFF2 of FIG. 18A. Referring to FIGS. 18A and 22, the first coefficient CFF1 and the second coefficient CFF2 of the interpolator 122_4 shown in FIG. 18A may be complementary to each other. As described above, the sum of the first and second coefficients CFF1 and CFF2 is 1. Here, for example, the first coefficient CFF1 may be set to linearly decrease, and the second coefficient CFF2 may be set to linearly increase in a first section of the interpolator 122_4. On the other hand, in a second section of the interpolator 122_4 that is next to the first section, the first coefficient CFF1 may be set to linearly decrease and the second coefficient CFF2 may be set to linearly increase.

In this case, when transiting the power voltage VDD output from the interpolator 122_4 and the uppermost bit in the lower bits of the digital control signal DCN, a rapid variation of the power voltage VDD due to a large variation in the first and second coefficients CFF1 and CFF2 may be prevented. As described above, the oscillation frequency fout may be sensitive to the variation in the power voltage VDD. According to the digitally controlled oscillator 100 of the present embodiment, even when transiting the uppermost bit in the lower band bits of the digital control signal DCN, the rapid variation in the power voltage VDD may be prevented, and accordingly, the oscillation frequency fout may be stably generated.

In the above description, a case where the first voltage level setting unit 122_3 outputs two temporary reference voltages Vtemps is described. However, the embodiments of the present inventive concept are not limited thereto. The first voltage level setting unit 122_3 may output two or more pairs of temporary reference voltages, and the second voltage level setting unit 122_4, for example, the interpolator 122_4, may apply coefficients to the difference between the two or more pairs of temporary reference voltages and the feedback signal of the power voltage VDD and add the differences to which the coefficients are applied to generate the reference voltage Vref. This will be described below.

Figure 23:
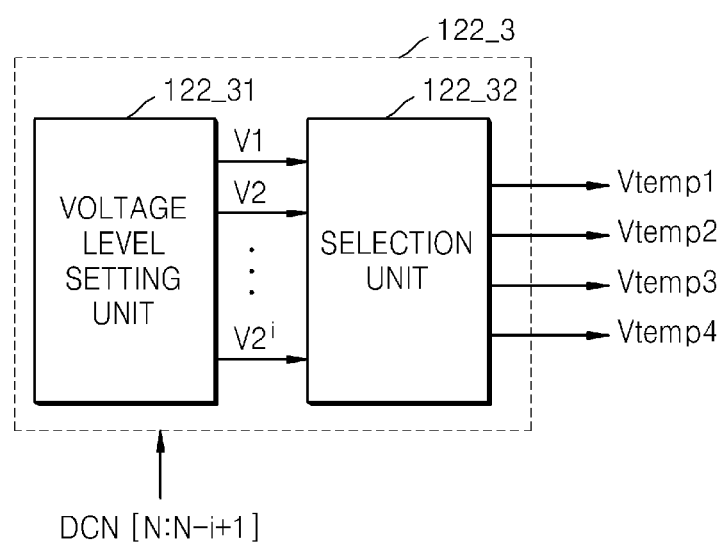
FIGS. 23 and 24 are diagrams respectively showing examples of first voltage level setting units shown in FIGS. 17 and 18A.
Figure 24:
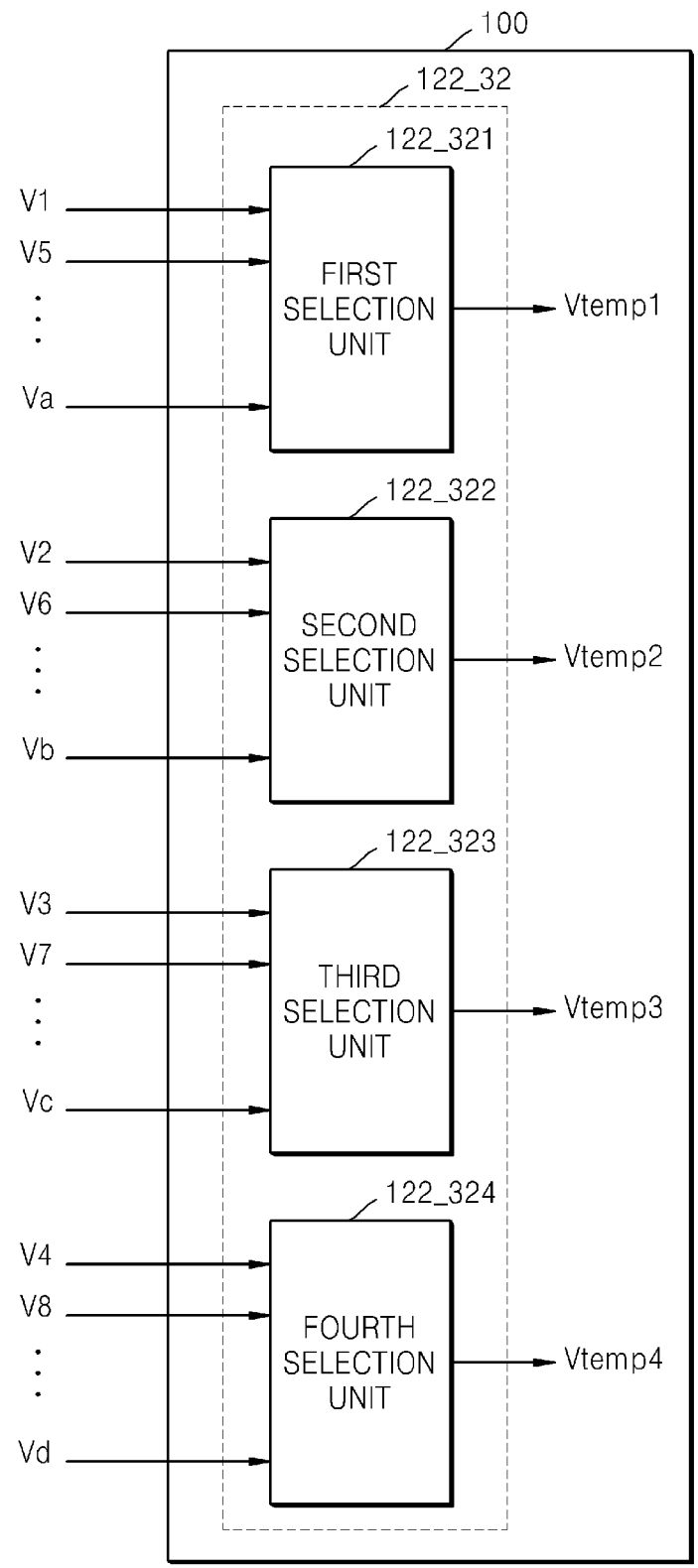

FIGS. 23 and 24 are diagrams of other examples of the first voltage level setting unit 122_3 shown in FIG. 18A. Referring to FIG. 23, the first voltage level setting unit 122_3 may output two pairs of temporary reference voltages, that is, a first temporary reference voltage Vtemp1, a second temporary reference voltage Vtemp2, a third temporary reference voltage Vtemp3, and a fourth temporary reference voltage Vtemp4, from among the voltage levels, a number of which corresponds to the number of upper bits in the digital control signal DCN. For example, if the number of upper bits of the digital control signal DCN is i, the first voltage level setting unit 122_3 may select and output the first through fourth temporary reference voltages Vtemp1 through Vtemp4 from among $2^i$ voltage levels V1, V2, ..., V$2^i$.

Otherwise, as shown in FIG. 24, the selection unit 122_32 in the first voltage level setting unit 122_3 may include a first selection unit 122_321 for selecting a first temporary reference voltage Vtemp1, a second selection unit 122_322 for selecting a second temporary reference voltage Vtemp2, a third selection unit 122_323 for selecting a third temporary reference voltage Vtemp3, and a fourth selection unit 122_324 for selecting a fourth temporary reference voltage Vtemp4. The first selection unit 122_321 may select one of the voltage levels of a first group as the first temporary reference voltage Vtemp1. The second selection unit 122_322 may select one of the voltage levels of a second group as the second temporary reference voltage Vtemp2. The third selection unit 122_323 may select one of the voltage levels of a third group as the third temporary reference voltage Vtemp3. The fourth selection unit 122_324 may select one of the voltage levels of a fourth group as the fourth temporary reference voltage Vtemp4. In the first voltage level setting unit 122_3 shown in FIG. 24, the selection unit 122_32 of the first voltage level setting unit 122_3 receives the voltages from outside of the digitally controlled oscillator 100, for example, described above with reference to FIG. 21.

Figure 25:
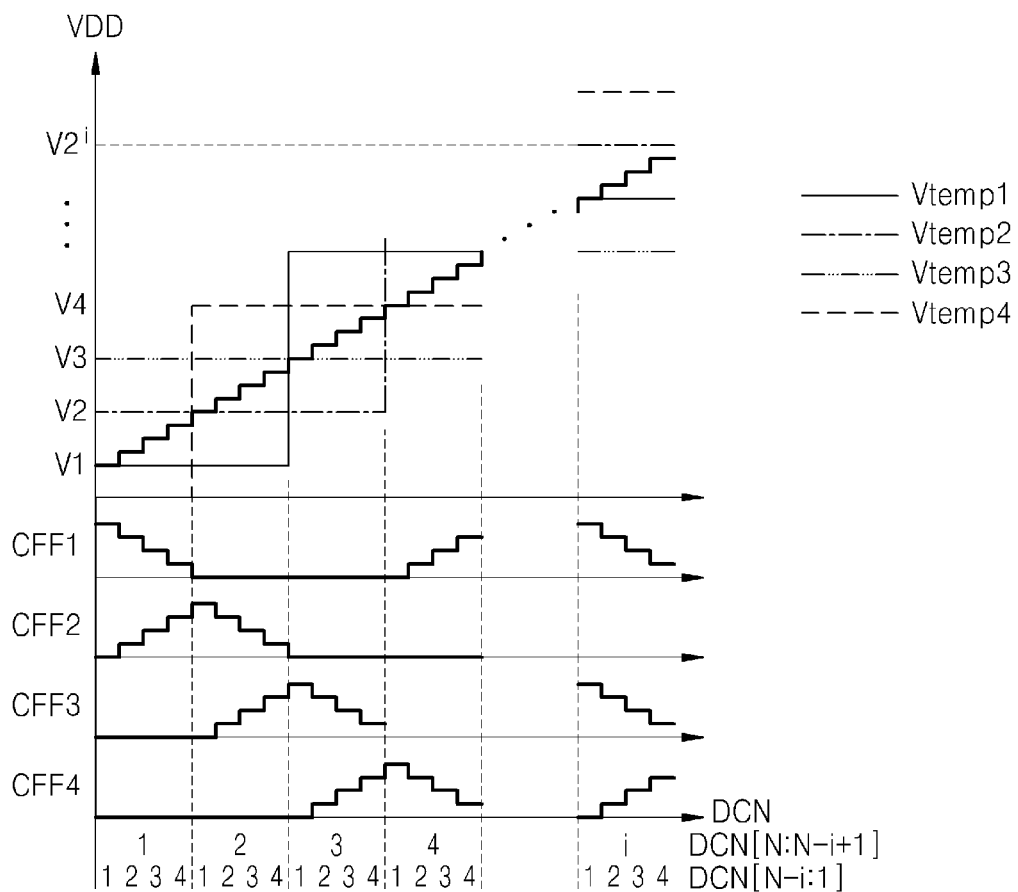
FIG. 25 is a diagram illustrating a relationship between coefficients of an interpolator shown in FIG. 18A.

FIG. 25 is a diagram illustrating a relationship between coefficients of the interpolator 122_4 shown in FIG. 18A. Referring to FIGS. 18A and 22, the interpolator 122_4 of FIG. 18A modulates the voltage levels of the first and second temporary reference voltages Vtemp1 and Vtemp2 by the first and second coefficients CFF1 and CFF2. However, the embodiments of the present inventive concept are not limited thereto. Although not shown in the drawings, the interpolator 122_4 of FIG. 18A may include multipliers for modulating the voltage levels of the first through fourth temporary reference voltages Vtemp1 through Vtemp4 by using first through fourth coefficients CFF1, CFF2, CFF3, and CFF4, respectively. The sum of the first through fourth coefficients CFF1 through CFF4 may be 1. In addition, as shown in FIG. 25, the first through fourth coefficients CFF1 through CFF4 may be circularly set.

For example, in a first section of the interpolator 122_4, the first coefficient CFF1 linearly decreases, the second coefficient CFF2 may linearly increase, and the third and fourth coefficients CFF3 and CFF4 may be set to a value of 0. In addition, in a second section of the interpolator 122_4 adjacent the first section, the first coefficient CFF1 has a value of 0, the second coefficient CFF2 linearly decreases, the third coefficient CFF3 linearly increases, and the fourth coefficient CFF4 may have a value of 0. In addition, in a third section adjacent the second section, the first and second coefficients CFF1 and CFF2 may have a value of 0, the third coefficient CFF3 may linearly decrease, and the fourth coefficient CFF4 may linearly increase. In addition, in a fourth section of the interpolator 122_4 adjacent the third section, the first coefficient CFF1 may linearly increase, the second coefficient CFF2 may have a value of 0, the third coefficient CFF3 may have a value of 0, and the fourth coefficient CFF4 may linearly increase. Accordingly, the first through fourth coefficients CFF1 through CFF4 may be set to have a linearly increasing state, a linearly decreasing state, and a zero state, sequentially.

In this case, when transiting the power voltage VDD output from the interpolator 122_4 and the uppermost bit of the lower bits of the digital control signal DCN, the rapid variation in the reference voltage Vref or the power voltage VDD due to a large amount of variation in the first through fourth coefficients CFF1 through CFF4 may be prevented. In each of the sections, a pair of coefficients between the two pairs of coefficients has a value of 0, which does not affect the power voltage VDD. That is, referring to FIG. 25, after transiting and stabilizing an arbitrary temporary reference voltage, the coefficient can be applied to the corresponding temporary reference voltage, therefore preventing a rapid change in the reference voltage Vref or the power voltage VDD. Therefore, according to the digitally controlled oscillator 100 of the present embodiment, even when the uppermost bit in the lower bits of the digital control signal DCN is transited, the rapid change in the power voltage VDD may be prevented, and thus, the oscillation frequency fout may be stably generated.

Figure 26:
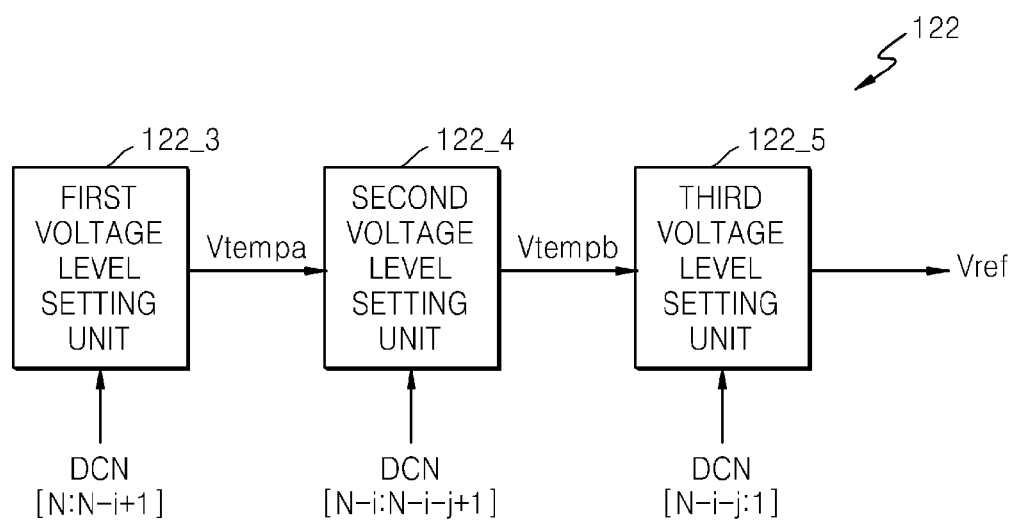
FIG. 26 is a diagram of another example of the voltage level setting unit shown in FIG. 4.

FIG. 26 is a diagram of another example of the voltage level setting unit 122 shown in FIG. 4. Referring to FIG. 26, a voltage level setting unit 122 may include a first voltage level setting unit 122_3, a second voltage level setting unit 122_4, and a third voltage level setting unit 122_5. The first voltage level setting unit 122_3 may generate a primary temporary reference voltage Vtempa based on an upper bit value (DCN[N:N−i+1]) of the digital control signal DCN. The second voltage level setting unit 122_4 generates a secondary temporary reference voltage Vtempb by modulating the voltage level of the primary temporary reference voltage Vtempa according to an intermediate bit value (DCN[N−i:N−i−j+1]) of the digital control signal DCN. The third voltage level setting unit 122_5 generates a reference voltage Vref by modulating the voltage level of the secondary temporary reference voltage Vtempb according to a lower bit value (DCN[N−j:1]) of the digital control signal DCN.

The first through third voltage level setting units 122_3, 122_4, and 122_5 may respectively include unit delay cells corresponding to the number of bits in the digital control signal DCN. In the example shown in FIG. 26, the number of bits of the digital control signals DCN applied to the first through third voltage level setting units 122_3, 122_4, and 122_5 are i, j, and N−i−j, respectively, and the first through third voltage level setting units 122_3, 122_4, and 122_5 may include $2^i-1$, $2^j-1$, and $2^{N-i-j}-1$ unit level cells, respectively.

In the above example, the primary temporary reference voltage Vtempa may be output as one of the $2^i$ voltage levels, the secondary temporary reference voltage Vtempb may be output as one of $2^j$ voltage levels with respect to each of the $2^1$ voltage levels, that is, $2^i \times 2^j$ voltage levels. Also, the secondary temporary reference voltage Vtempb may be output as one of $2^{N-i-j}$ voltage levels with respect to each of the $2^i$ and $2^j$ voltage levels of the secondary temporary reference voltage Vtempb, that is, $2^i \times 2^j \times 2^{N-i-j}$ voltage levels. Therefore, the unit level cells included in the voltage level setting unit 122 is $(2^i-1)+(2^j-1)+(2^{N-i-j}-1)$ that is less than $2^N-1$ while maintaining a signal resolution.

Figure 27:
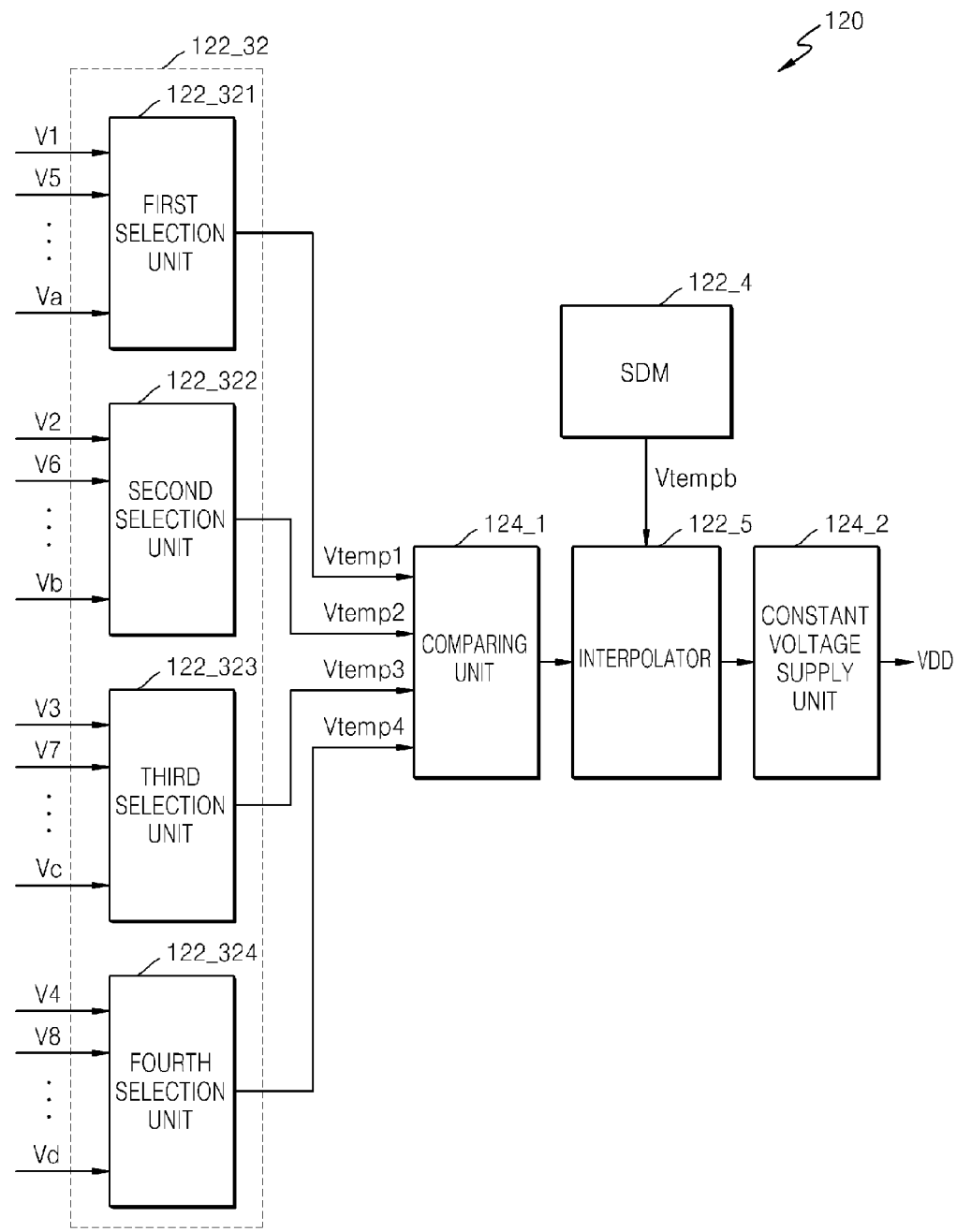
FIGS. 27 and 28 are diagrams of examples of a digital control unit including the voltage level setting unit of FIG. 26.

FIG. 27 is a diagram of another example of the digital control unit 120 shown in FIG. 4. Referring to FIG. 27, the selection unit 122_32 may output, for example, a first temporary reference voltage Vtemp1, a second temporary reference voltage Vtemp2, a third temporary reference voltage Vtemp3, and a fourth temporary reference voltage Vtemp4. In this case, the selection unit 122_32 may include a first selection unit 122_321, a second selection unit 122_322, a third selection unit 122_323, and a fourth selection unit 122_324 respectively selecting one of voltage levels of corresponding groups based on the upper bit value (DCN[N:N−i+1]) of the digital control signal DCN. The first through fourth selection units 122_321 through 122_324 may output a first temporary reference voltage Vtemp1, a second temporary reference voltage Vtemp2, a third temporary reference voltage Vtemp3, and a fourth temporary reference voltage Vtemp4, respectively. The voltage level generator 122_31 shown in FIG. 23 may be included in the digital control unit 120 of FIG. 27. However, the embodiments of the present inventive concept are not limited thereto, and the selection unit 122_32 may select only a pair of temporary reference voltages, that is, first and second temporary reference voltages Vtemp1 and Vtemp2, by using one selection unit 122_3, as shown in FIG. 19.

Figure 28:
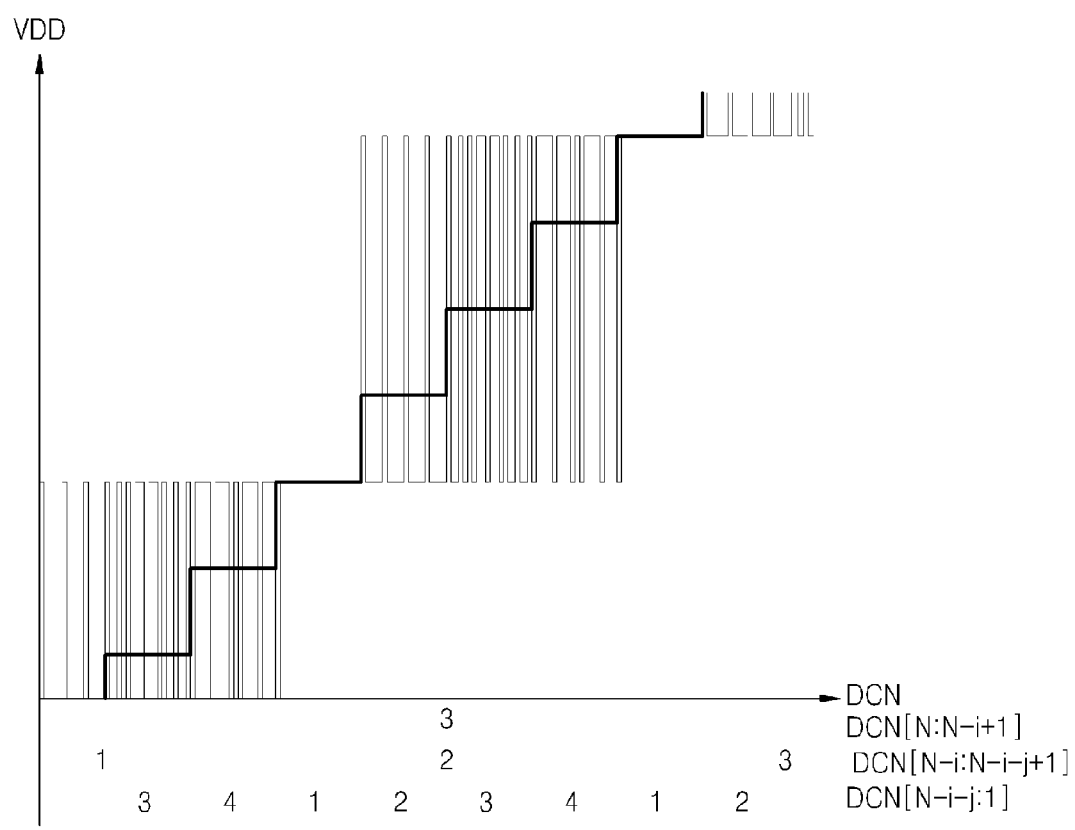

The digital control unit 120 of FIG. 27 may further include an interpolator 122_5 and a sigma-delta modulator (SDM) 122_4 with the selection unit 122_32, in order to set the voltage level of the power voltage VDD. The interpolator 122_5 may have the structures and perform operations described with reference to FIG. 18A and/or FIG. 25. The coefficients of the interpolator 122_5 shown in FIG. 27, for example, the first coefficient CFF1 and the second coefficient CFF2 shown in FIG. 18A may be modulated by the SDM 122_4. Accordingly, as shown in FIG. 28, fewer unit level cells may be used to realize a same resolution, which in turn may translate to a reduced layout area as compared to conventional digitally controlled oscillators.

Figure 29:
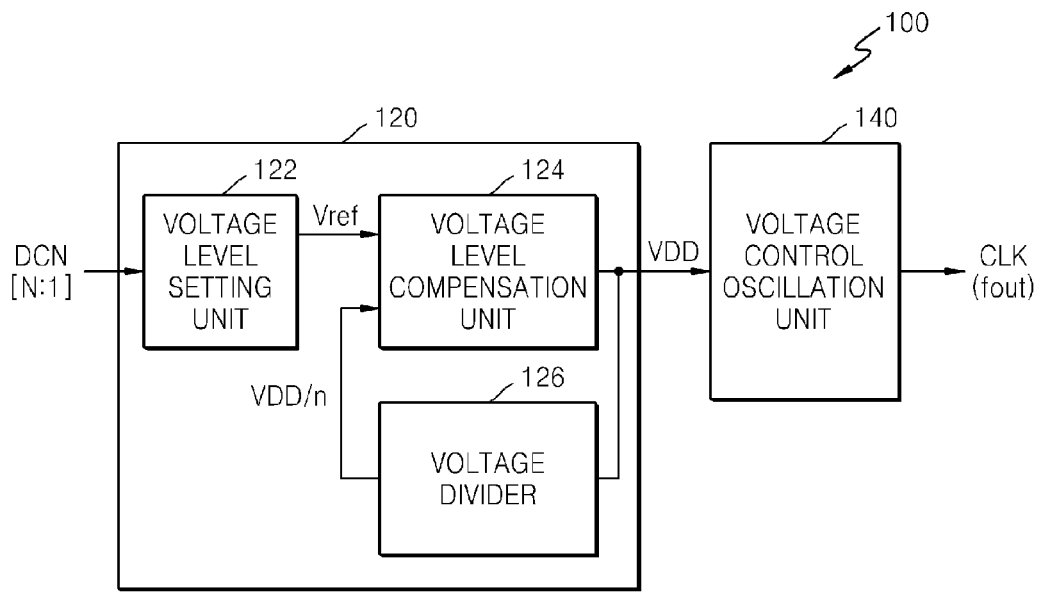
FIG. 29 is a diagram of another example of the digitally controlled oscillator shown in FIG. 4.

FIG. 29 is a diagram of another example of the digitally controlled oscillator 100 shown in FIG. 4. Referring to FIG. 29, in the digitally controlled oscillator 100, a feedback signal to the voltage level compensation unit 124 is a signal dividing the power voltage VDD (VDD/n), not the power voltage VDD. To achieve this, the digitally controlled oscillator 100 of FIG. 29 divides the power voltage VDD into n segments and applies the divided signals to the voltage level compensation unit 124. A voltage divider 126 may include a resistive divider (not shown) in order to divide the power voltage VDD. The voltage level compensation unit 124 of FIG. 29 may have the structure shown in FIG. 8 or FIG. 18A. However, since a difference between the reference voltage Vref or the temporary reference voltage Vtemp and the divided power voltage (VDD/n), not the difference between the reference voltage Vref or the temporary reference voltage Vtemp and the power voltage VDD, is compensated for, a design change may be necessary. For example, a current source that may included in the voltage level compensation unit 124 of FIG. 29 may supply a current that is different from the current supplied by the current source of the constant voltage supply unit 124_2 of FIG. 8 to correspond to the difference value DIF.

Figure 30:
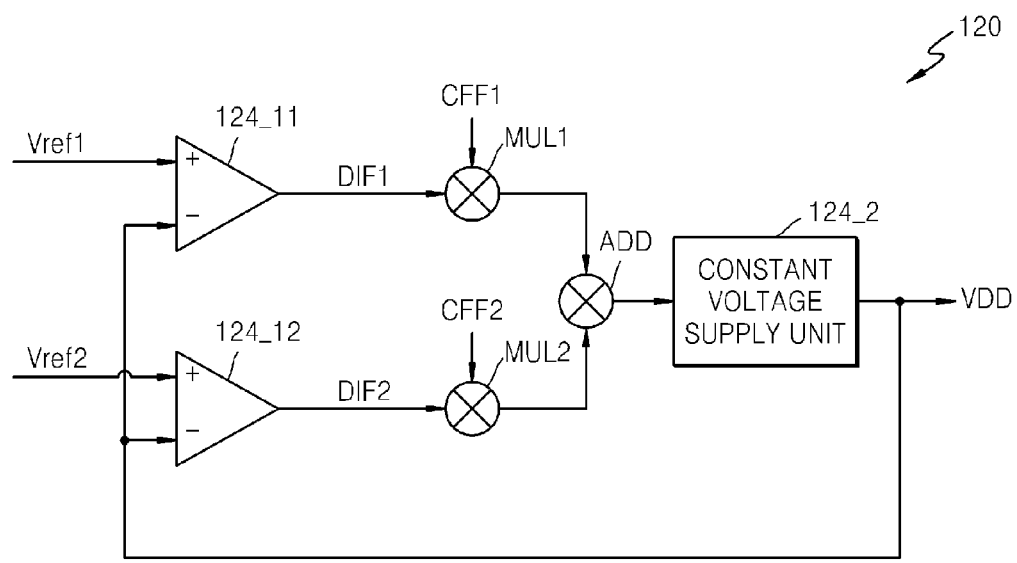
FIGS. 30 and 31 are diagram of other examples of the digital control unit shown in FIG. 4.
Figure 31:
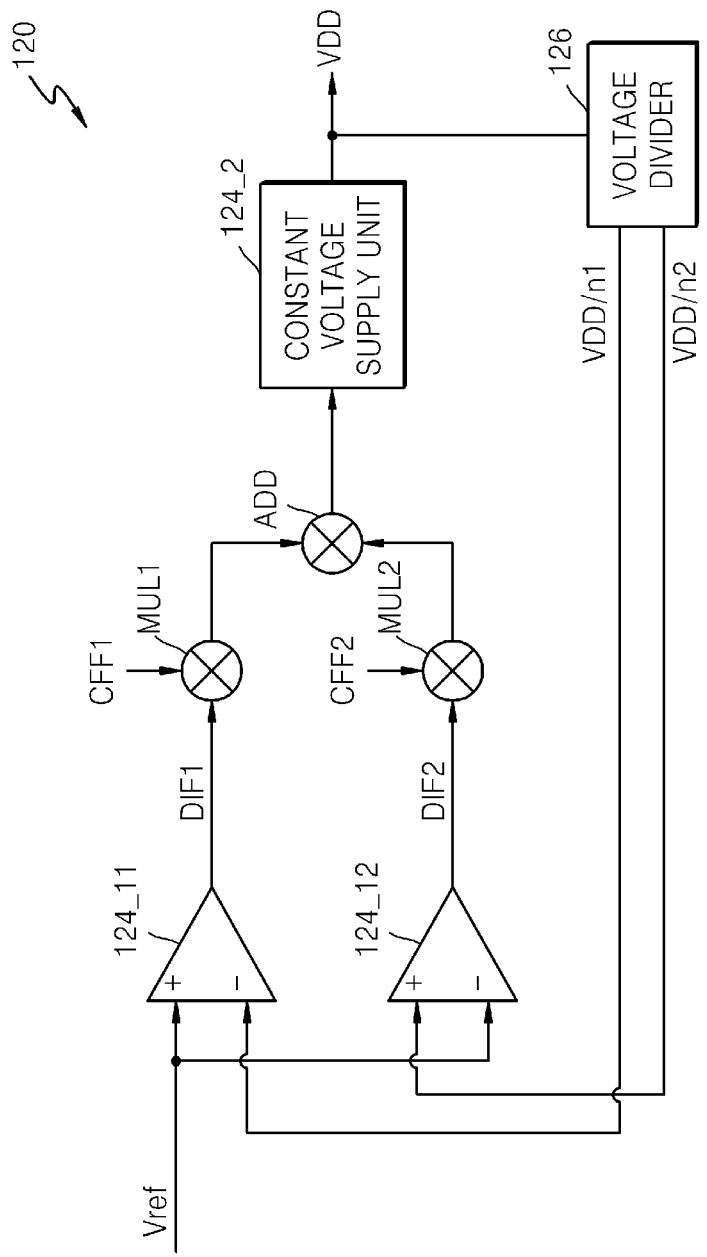

FIGS. 30 and 31 are diagrams of examples of the digital control unit 120 of FIG. 4. Referring to FIGS. 4 and 30, the voltage level setting unit 122 includes an interpolator in the digital control unit 120 of FIG. 30. Structures and operations of the interpolator are described above, and thus, detailed descriptions thereof are omitted here. However, the interpolator shown in FIG. 30 may include comparators 124_11 and 124_12 with the first and second multipliers MUL1 and MUL2. The interpolator of FIG. 30 applies the first coefficient CFF1 and the second coefficient CFF2, each coefficient having one of 2N values, to the first difference value DIF1 and the second difference value DIF2 with respect to the digital control signal DCN of N bits, and supplies the results, for example, output from a summing device (ADD) to the constant voltage supply unit 124_2.

In FIG. 30, the first and second difference values DIF1 and DIF2 applied in the interpolator are calculated between first and second temporary reference voltages Vref1 and Vref2 and the feedback signal of the power voltage VDD. However, the embodiments of the present invention are not limited thereto. Referring to FIG. 31, the first and second difference values DIF1 and DIF2 applied in the interpolator may be calculated by comparing the temporary reference voltage Vref with a first divided voltage (VDD/n1) and a second divided voltage (VDD/n2) divided by the voltage divider 126.

Figure 32:
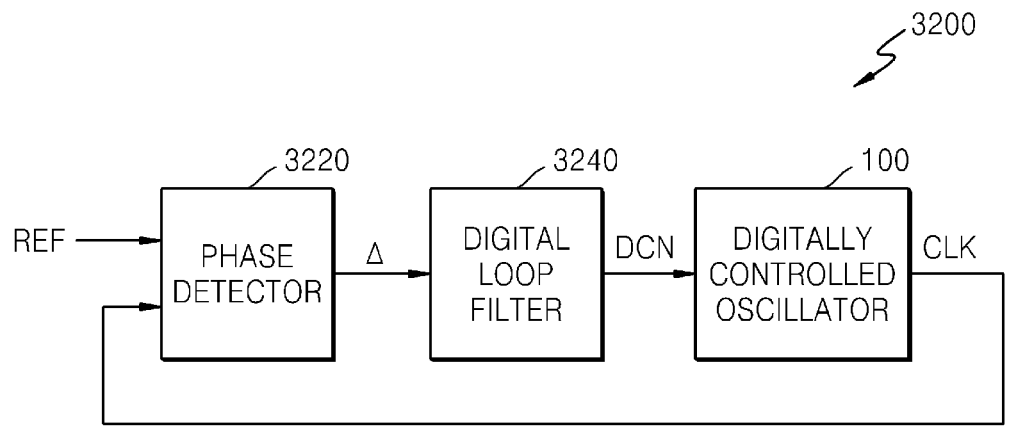
FIG. 32 is a diagram of an example of a phase locked loop including the digitally controlled oscillator according to an embodiment of the present inventive concept.

FIG. 32 is a diagram of an example of a phase locked loop 3200 including a digitally controlled oscillator 100 according to an embodiment of the present inventive concept. Referring to FIG. 32, the phase locked loop 3200 may include a phase detector 3220, a digital loop filter 3240, and the digitally controlled oscillator 100. The phase locked loop 3200 may be a feedback circuit that generates a signal having an arbitrary frequency generated in response to a frequency of an external signal. The phase detector 3220 compares a reference signal REF and an output clock CLK output from the digitally controlled oscillator 100, and outputs a phase difference (Δ) therebetween, which is output to the digital loop filter 3240. The digital loop filter 3240 may provide the digitally controlled oscillator 100 with a digital control signal DCN corresponding to the phase difference Δ. To do this, the digital loop filter 3240 may include a decoder (not shown) for decoding the phase difference Δ and outputting a decoded signal as the digital control signal DCN.

Figure 33:
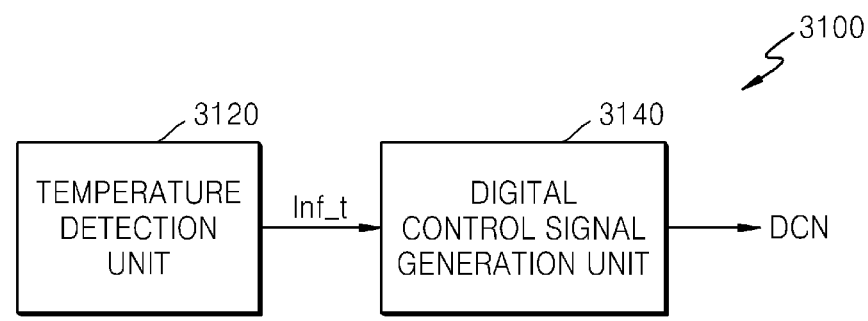
FIG. 33 is a diagram of an example of generating a digital control signal, according to an embodiment of the present inventive concept.

FIG. 33 is a diagram of an example of generating a digital control signal DCN. Referring to FIG. 33, the digital control signal DCN may be generated by a temperature detection unit 3120 that may be included in an electronic device including the digitally controlled oscillator 100. The temperature detection unit 3120 detects a temperature of the digitally controlled oscillator 100 or a temperature of the electronic device including the digitally controlled oscillator 100. Accordingly, the temperature detection unit 3120 may generate a temperature code Inf_t corresponding to a difference between a reference temperature and the detected temperature. The digital control signal generator 3140 may receive the temperature code Inf_t and generate the temperature code as a corresponding digital control signal DCN.

Referring back to FIG. 32, the digitally controlled oscillator 100 may adjust a frequency of the output clock CLK in response to the digital control signal DCN applied from the digital loop filter 3240. According to the phase locked loop 3200 of the present embodiment, a stabilized and accurate frequency may therefore be generated with a small area.

Figure 34:
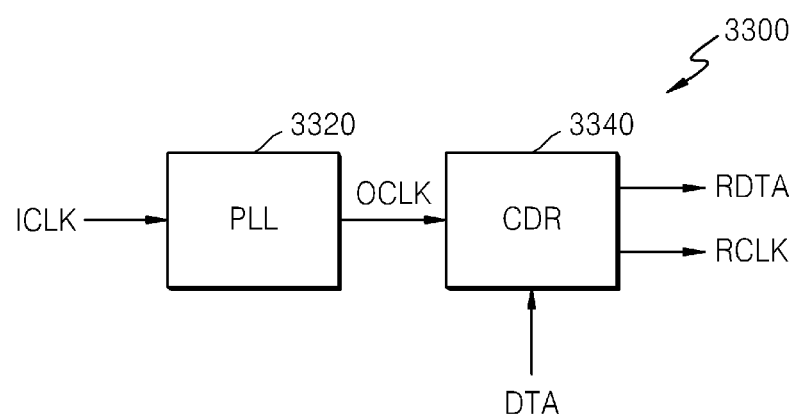
FIG. 34 is a diagram of an example of a clock data recovery circuit including the digitally controlled oscillator according to an embodiment of the present inventive concept.

FIG. 34 is a diagram of an example a clock data recovery circuit 3300 including a digitally controlled oscillator 100 according to an embodiment of the present inventive concept. Referring to FIG. 34, the clock data recovery circuit 3300 may include a phase locked loop 3320 and a recovery unit 3340. Due to high integration and high speed requirements typically of a device or a system, data may be only transmitted without transmitting an additional clock signal or data, including information about a clock signal, by using a high speed serial communication method. Accordingly, a receiving device may determine clock information from the data transmitted from a transmitting device, and the clock data recovery circuit 3300 may synchronize the clock information with the data.

The phase locked loop 3320 compares an input clock ICLK and an output clock OCLK output from the digitally controlled oscillator 100 to adjust the output clock OCLK, as described with reference to FIG. 32. The recovery unit 3340 receives information about the output clock OCLK, that is, the clock signal, and recovers data and a clock (RDTA and RCLK) from input data DTA. According to the clock data recovery circuit 3300 of the present embodiment, the frequency may be accurately and stably generated with a small area, and thus, the data and the clock may be exactly recovered.

Figure 35:
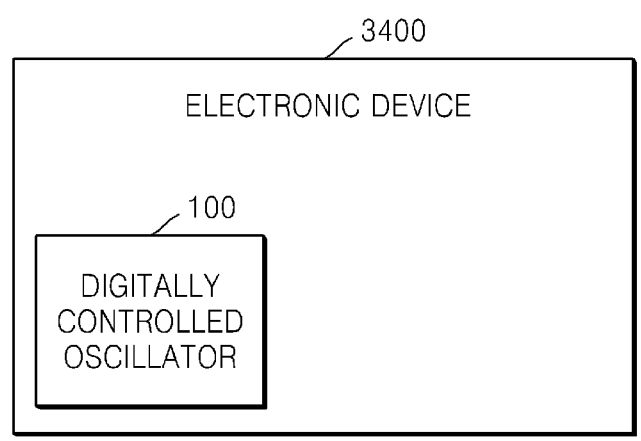
FIG. 35 is a diagram of an example of an electronic device including the digitally controlled oscillator according to the embodiment of the present inventive concept.

FIG. 35 is a diagram of an example of an electronic device including the digitally controlled oscillator 100 according to an embodiment of the present inventive concept. Referring to FIG. 35, the electronic device 3400 may supply clocks used in each of the functional blocks (not shown) according to the digitally controlled oscillator 100. The clocks used in each of the functional blocks may be the same or different. The functional blocks of the electronic device 3400 may be synchronized by the provided clocks and operate. The electronic device 3400 may be various types of electronic devices, such as TVs, smartphones, and tablet PCs. Therefore, the electronic device 3400 of the present embodiment may provide for a frequency that is accurately and stably generated with a small area, and accurate and stabilized operations may be performed.

While the inventive concept has been particularly shown and described with reference to exemplary embodiments thereof, it will be understood that various changes in form and details may be made therein without departing from the spirit and scope of the following claims.

What is claimed is:

1. A digitally controlled oscillator comprising:
a digital control unit that compensates for a difference between a feedback signal received from an output of the digital control unit and a reference power, and outputs an output power in response to the compensated difference, wherein a power level of the reference power is set in response to a digital control signal, wherein the digital control signal has a first bit location value and a second bit location value, and wherein the digital control unit generates a temporary reference power in response to the first bit location value of the digital control signal, modulates a power level of the temporary reference power, and outputs the modulated power level as the reference power in response to the second bit location value of the digital control signal, wherein the digital control unit further comprises a divider for dividing the output power, compensates for a difference between the divided output power and the reference power, and outputs a compensated value as the output power, the feedback signal including the divided output power, wherein the digital control unit comprises:
a comparing unit that generates a first difference value and a second difference value in response to a comparison performed between the reference power and the divided output power;
a first multiplier that multiplies the first difference value by a first coefficient;
a second multiplier that multiplies the second difference value by a second coefficient;
an adder that adds an output of the first multiplier and an output of the second multiplier; and
a constant power supply unit that controls a current according to an output of the adder and that outputs the output power; and
a power control oscillation unit that receives a signal related to the output power, and generates an output clock having an oscillation frequency in response to the signal related to the output power.

2. The digitally controlled oscillator of claim 1, wherein the digital control unit comprises:
a first comparing unit that compares a first reference power of the reference power and the feedback signal to generate the first difference value;
a second comparing unit that compares a second reference power of the reference power and the feedback signal to generate the second difference value.

3. An electronic device comprising: a digitally controlled oscillator, comprising:
a digital control unit that outputs an output power by compensating for a difference between a feedback signal received from an output of the digital control unit and a reference power, a power level of the reference power set in response to a digital control signal, wherein the digital control signal has a first bit location value and a second bit location value, and wherein the digital control unit generates a temporary reference power in response to the first bit location value of the digital control signal, modulates a power level of the temporary reference power, and outputs the modulated power level as the reference power in response to the second bit location value of the digital control signal, wherein the digital control unit further comprises a divider for dividing the output power, compensates for a difference between the divided output power and the reference power, and outputs a compensated value as the output power, the feedback signal including the divided output power, wherein the digital control unit comprises:
a comparing unit that generates a first difference value and a second difference value in response to a comparison performed between the reference power and the divided output power;
a first multiplier that multiplies the first difference value by a first coefficient;
a second multiplier that multiplies the second difference value by a second coefficient;
an adder that adds an output of the first multiplier and an output of the second multiplier; and
a constant power supply unit that controls a current according to an output of the adder and outputs the output power; and
a power control oscillation unit that receives a signal related to the output power, and generates an output clock having an oscillation frequency in response to the signal related to the output power; and
a functional block that operates in synchronization with an output clock.

4. A digitally controlled oscillator comprising:
a digital control unit that receives a digital control signal, generates a reference power in response to the digital control signal, generates a comparison value by comparing the reference power to a feedback signal received from an output of the digital control unit, and generates an output power in response to the comparison value, wherein the digital control signal has a first bit location value and a second bit location value, and wherein the digital control unit generates a temporary reference power in response to the first bit location value of the digital control signal, modulates a power level of the temporary reference power, and outputs the modulated power level as the reference power in response to the second bit location value of the digital control signal, wherein the digital control unit further comprises a divider for dividing the output power, compensates for a difference between the divided output power and the reference power, and outputs a compensated value as the output power, the feedback signal including the divided output power, wherein the digital control unit comprises:
a comparing unit that generates a first difference value and a second difference value in response to a comparison performed between the reference power and the divided output power;
a first multiplier that multiplies the first difference value by a first coefficient;
a second multiplier that multiplies the second difference value by a second coefficient;
an adder that adds an output of the first multiplier and an output of the second multiplier; and
a constant power supply unit that controls a current according to an output of the adder and outputs the output power; and
a power control oscillation unit that receives the output power and generates an output clock at an oscillation frequency corresponding to the output power.

5. The digitally controlled oscillator of claim 4, wherein the digital control unit comprises:
a power level setting unit that sets a power level of the reference power in response to the digital control signal; and a power level compensation unit that generates the comparison value by compensating for the difference between the reference power and the feedback signal.

6. The digitally controlled oscillator of claim 5, wherein the power level setting unit comprises: a plurality of unit level cells, a number of which corresponds to a value of $2^N$, wherein N is a number of bits in the digital control signal; and a selection unit for selecting the power level of the reference power as one of first power levels by turning on or turning off of each of the unit level cells in response to the digital control signal, wherein a number of the first power levels is the same as the value of $2^N$.

7. The digitally controlled oscillator of claim 6, wherein the power level setting unit comprises:
   a first power level setting unit that outputs the temporary reference power in response to the first bit location value of the digital control signal; and
   a second power level setting unit that modulates a power level of the temporary reference power and outputs the modulated temporary reference power as the reference power in response to the second bit location value of the digital control signal.

8. A digitally controlled oscillator comprising:
   a digital control unit that compensates for a difference between a feedback signal received from an output of the digital control unit and a reference power, and outputs an output power in response to the compensated difference, wherein a power level of the reference power is set in response to a digital control signal, wherein the digital control signal has a first bit location value and a second bit location value, and wherein the digital control unit generates a temporary reference power in response to the first bit location value of the digital control signal, modulates a power level of the temporary reference power, and outputs the modulated power level as the reference power in response to the second bit location value of the digital control signal, wherein the digital control unit comprises:
   a power level setting unit for setting the power level of the reference power in response to the digital control signal, wherein the power level setting unit comprises:
   a first power level setting unit that outputs the temporary reference power in response to the first bit location value of the digital control signal; and
   a second power level setting unit that modulates the power level of the temporary reference power and outputs the modulated temporary reference power as the reference power in response to the second bit location value of the digital control signal; and
   a power level compensation unit for compensating for the difference between the reference power and the feedback signal, wherein the first power level setting unit sets two second power levels as a first power level and a second power level, respectively, of the temporary reference power, and the second power level setting unit sets the power level of the reference power, wherein the number of the second power levels corresponds to the first bit location value, wherein the power level of the reference power is obtained by adding a third power level and a fourth level, wherein the third power level is calculated by applying a first coefficient to a first difference value corresponding to the first power level of the temporary reference power and a power level of the feedback signal of the output power, and wherein the fourth power level is calculated by applying a second coefficient to a second difference value corresponding to a difference between the second power level of the temporary reference power and the power level of the feedback signal of the output power; and
   a power control oscillation unit that receives a signal related to the output power, and generates an output clock having an oscillation frequency in response to the signal related to the output power.

9. The digitally controlled oscillator of claim 8, wherein the power level setting unit comprises:
   the power level setting unit including a plurality of unit level cells, a number of which corresponds to a value of $2^N$, wherein N is a number of bits in the digital control signal; and
   a selection unit for selecting the power level of the reference power as one of first power levels by turning on or turning off of each of the unit level cells in response to the digital control signal,
   wherein a number of the first power levels is the same as the value of $2^N$.

10. The digitally controlled oscillator of claim 8, wherein a sum of the number of the unit level cells included in the first power level setting unit and the second power level setting unit is less than a value of $2^N$.

11. The digitally controlled oscillator of claim 8, wherein the first bit location value of the digital control signal is a value represented by an arbitrary number of upper bits in the digital control signal, and the second bit location value of the digital control signal is a value represented by other bits except for the arbitrary number of upper bits in the digital control signal.

12. The digitally controlled oscillator of claim 8, wherein the first power level setting unit sets one of a plurality of second power levels as a power level of the temporary reference power, and the second power level setting unit applies one of weighted values to the power level of the temporary reference power to set the power level of the reference power, and wherein the number of the second power levels corresponds to a number of arbitrary upper bits of the digital control signal representing the first bit location value, and the number of the weighted values corresponds to the number of remaining bits except for the arbitrary upper bits in the digital control signal.

13. The digitally controlled oscillator of claim 8, wherein a sum of the first coefficient and the second coefficient is 1, and the first coefficient is in a monotone increasing state and the second coefficient is in a monotone decreasing state, or the first coefficient is in a monotone decreasing state and the second coefficient is in a monotone increasing state, with respect to the power level of the temporary reference power.

14. The digitally controlled oscillator of claim 8, further comprising a sigma-delta modulator (SDM) for modulating the first and second coefficients.

* * * * *

UNITED STATES PATENT AND TRADEMARK OFFICE
CERTIFICATE OF CORRECTION

PATENT NO.        : 9,444,472 B2
APPLICATION NO.   : 14/322280
DATED             : September 13, 2016
INVENTOR(S)       : Du-ho Kim Page 1 of 1

It is certified that error appears in the above-identified patent and that said Letters Patent is hereby corrected as shown below:

In the Claims
Claim 1, Column 23, Line 19, Please delete the word "further" after the word "unit" and before the word "comprises"
Claim 1, Column 23, Line 24, Please insert --further-- after the word "unit" and before the word "comprises"
Claim 3, Column 23, Line 66, Please delete the word "further" after the word "unit" and before the word "comprises"
Claim 3, Column 24, Line 4, Please insert --further-- after the word "unit" and before the word "comprises"
Claim 4, Column 24, Line 40, Please delete the word "further" after the word "unit" and before the word "comprises"
Claim 4, Column 24, Line 45, Please insert --further-- after the word "unit" and before the word "comprises"

Signed and Sealed this
First Day of November, 2016

Michelle K. Lee
*Director of the United States Patent and Trademark Office*